(12) United States Patent
Xiao et al.

(10) Patent No.: US 12,471,274 B2
(45) Date of Patent: Nov. 11, 2025

(54) SEMICONDUCTOR STRUCTURE

(71) Applicant: CHANGXIN MEMORY TECHNOLOGIES, INC., Hefei (CN)

(72) Inventors: Deyuan Xiao, Hefei (CN); Kanyu Cao, Hefei (CN); Yiming Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 475 days.

(21) Appl. No.: 18/167,132

(22) Filed: Feb. 10, 2023

(65) Prior Publication Data
US 2024/0049457 A1 Feb. 8, 2024

Related U.S. Application Data

(63) Continuation of application No. PCT/CN2022/112956, filed on Aug. 7, 2022.

(30) Foreign Application Priority Data

Aug. 4, 2022 (CN) .......................... 202210933308.6

(51) Int. Cl.
*H10B 12/00* (2023.01)
(52) U.S. Cl.
CPC ........... *H10B 12/488* (2023.02); *H10B 12/02* (2023.02); *H10B 12/482* (2023.02)
(58) Field of Classification Search
CPC .... H10B 12/488; H10B 12/02; H10B 12/482; H10B 12/20; H10B 12/01; H10D 30/6728; H10D 30/025; H10D 30/63; G11C 8/14
See application file for complete search history.

(56) References Cited

U.S. PATENT DOCUMENTS

| | | | |
|---|---|---|---|
| 4,939,390 A * | 7/1990 | Coe | H03K 19/00384 |
| | | | 326/115 |
| 4,974,060 A | 11/1990 | Ogasawara | |

(Continued)

FOREIGN PATENT DOCUMENTS

| | | |
|---|---|---|
| CN | 103367369 A | 10/2013 |
| CN | 114497044 A | 5/2022 |

(Continued)

OTHER PUBLICATIONS

A. Belmonte,et,al. "Capacitor-less, Long-Retention (>400s) DRAM Cell Paving the Way towards Low-Power and High-Density Monolithic 3D DRAM", 2020 IEEE International Electron Devices Meeting (IEDM), DOI: 10.1109/IEDM13553.2020.9371900, 4 pages.

(Continued)

*Primary Examiner* — Tucker J Wright
(74) *Attorney, Agent, or Firm* — Kilpatrick Townsend & Stockton LLP

(57) ABSTRACT

Embodiments of the disclosure provide a semiconductor structure and a method for manufacturing the same. The semiconductor structure includes: a substrate; a semiconductor pillar located on the substrate and a gate pillar located on the semiconductor pillar, in which the semiconductor pillar and the gate pillar both extend in a direction perpendicular to a plane of the substrate; a first word line extending in a first direction parallel to the plane of the substrate and surrounding the semiconductor pillar; and a semiconductor layer located above the semiconductor pillar and at least surrounding a sidewall of the gate pillar.

7 Claims, 26 Drawing Sheets

(56) References Cited

U.S. PATENT DOCUMENTS

| | | |
|---|---|---|
| 8,008,698 B2 | 8/2011 | Lee |
| 8,809,930 B2 | 8/2014 | Jeon |
| 2009/0121268 A1 | 5/2009 | Lee |
| 2010/0163974 A1 | 7/2010 | Oh |
| 2013/0256774 A1 | 10/2013 | Jeon |
| 2021/0066302 A1 | 3/2021 | Karda |
| 2021/0202485 A1* | 7/2021 | Inaba .................... H10B 12/05 |
| 2022/0130832 A1 | 4/2022 | Tsai |
| 2022/0208254 A1 | 6/2022 | Sakui et al. |
| 2022/0208855 A1 | 6/2022 | Zhu et al. |
| 2022/0293604 A1 | 9/2022 | Tsai |
| 2023/0276612 A1* | 8/2023 | Harada ................... H10B 61/22 |
| | | 257/314 |

FOREIGN PATENT DOCUMENTS

| | | | |
|---|---|---|---|
| CN | 114695353 A | 7/2022 | |
| KR | 1020130109821 A | 10/2013 | |
| WO | 2022097251 A1 | 5/2022 | |

OTHER PUBLICATIONS

A. Belmonte, et, al. "Tailoring IGZO-TFT architecture for capacitorless DRAM, demonstrating > 103s retention, >1011 cycles endurance and Lg scalability down to 14nm", IMEC, IEDM 2021, 978-1-6654-2572-8/21/$31.00 © 2021 IEEE, 4 pages.

Xin Duan, et, al. "Novel Vertical Channel-All-Around(CAA) IGZO FETs for 2T0C DRAM with High Density beyond 4F2 by Monolithic Stacking", IEDM 2021, 978-1-6654-2572-8/21/$31.00 © 2021 IEEE, 4 pages.

European Patent Office, Extended European Search Report Issued in Application No. 22922574.3, Jun. 21, 2024, Germany, 8 pages.

Korean Intellectual Property Office, First Office Action from corresponding Korean Application No. 10-2023-7021794, mailed Mar. 26, 2024, 11 pages.

Taiwan Intellectual Property Office, First Office Action from corresponding Taiwan Application No. 112122193, mailed Jan. 16, 2024, 6 pages with English summary.

* cited by examiner

SEMICONDUCTOR STRUCTURE

CROSS-REFERENCE TO RELATED APPLICATION

The application is a U.S. continuation application of International Application No. PCT/CN2022/112956, filed on Aug. 17, 2022, which based upon and claims priority to Chinese Patent Application No. 202210933308.6, filed on Aug. 4, 2022. The disclosures of International Application No. PCT/CN2022/112956 and Chinese Patent Application No. 202210933308.6 are hereby incorporated by reference in their entireties.

TECHNICAL FIELD

The disclosure relates to the technical field of semiconductor manufacturing, in particular to a semiconductor structure and a method for manufacturing the same.

BACKGROUND

With the development and progress of technology, the dimension of semiconductor devices becomes smaller and smaller, and the semiconductor devices are constantly developing towards miniaturization and high integration. Dynamic random access memory (DRAM) is a kind of semiconductor device that writes and reads data randomly at high speed, and is frequently and widely used in data storage devices or installations. However, there are still many problems in the structure of dynamic random access memory.

SUMMARY

Embodiments of the disclosure provide a semiconductor structure. The semiconductor structure includes: a substrate; a semiconductor pillar located on the substrate and a gate pillar located on the semiconductor pillar, in which the semiconductor pillar and the gate pillar both extend in a direction perpendicular to a plane of the substrate; a first word line extending in a first direction parallel to the plane of the substrate and surrounding the semiconductor pillar; and a semiconductor layer located above the semiconductor pillar and at least surrounding a sidewall of the gate pillar.

The embodiments of the disclosure also provide a method for manufacturing a semiconductor structure. The method includes the following operations.

A substrate is provided.

A pillar is formed on the substrate, includes a semiconductor pillar, and extends in a direction perpendicular to a plane of the substrate.

A first word line extending in a first direction parallel to the plane of the substrate and surrounding part of the pillar is formed.

A gate pillar is formed right above the semiconductor pillar. The gate pillar extends in the direction perpendicular to the plane of the substrate.

A semiconductor layer is formed. The semiconductor layer at least surrounds a sidewall of the gate pillar.

BRIEF DESCRIPTION OF THE DRAWINGS

In order to more clearly illustrate the technical solutions in the embodiments of the disclosure, the drawings used in the embodiments will be briefly described below. It is apparent that the drawings in the following descriptions are merely some embodiments of the disclosure. Other drawings can be obtained by a person skilled in the art according to these drawings without any creative work.

DETAILED DESCRIPTION

Figure 1:
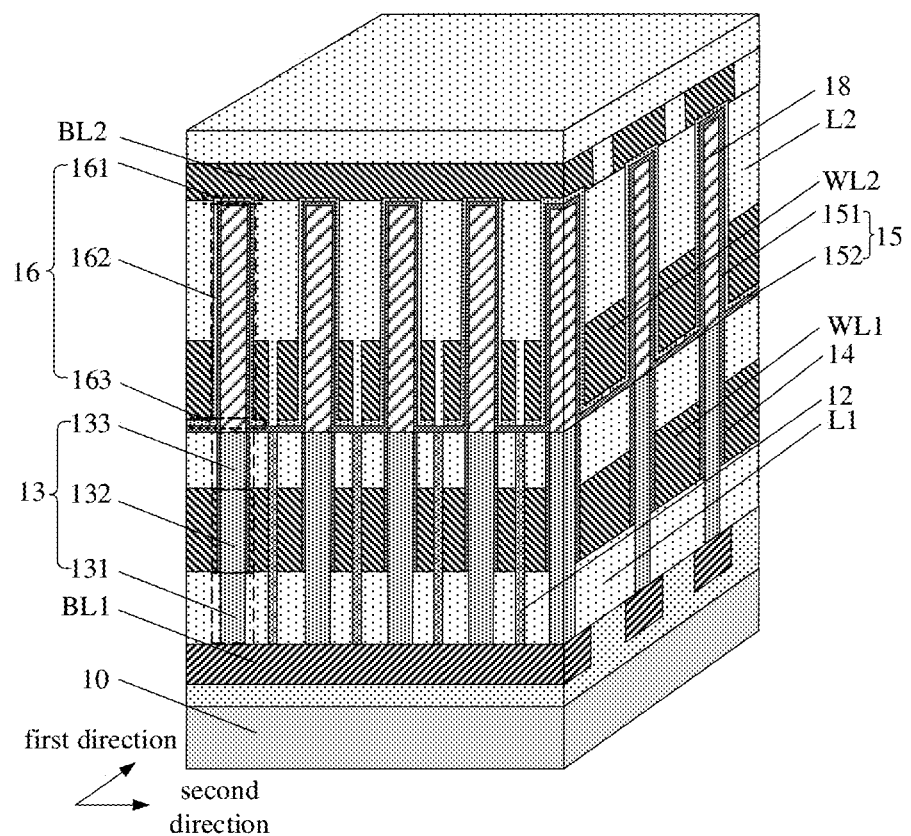
FIG. 1 schematically shows a structure of a semiconductor structure provided by an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following descriptions, a lot of specific details are given in order to provide the more fully understanding of the disclosure. However, it is apparent to a person skilled in the art that the disclosure may be implemented without one or more of these details. In other examples, in order to avoid confusion with the disclosure, some technical features well-known in the field are not described. Namely, not all of the features of an actual embodiment are described here, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used herein for conveniently describing a relationship between one element or feature and another element or feature shown in the drawings. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In a common dynamic random access memory (DRAM), a memory cell usually consists of one transistor and one capacitor (1T1C), and the capacitor is used to store data. However, 1T1C DRAM has high requirements for an amount of charge stored in the capacitor. Reading operation to the capacitor is destructive, which requires the data to be rewritten after the reading operation, thereby increasing the power consumption. Meanwhile, because of the complex manufacturing process and high occupied volume, the miniaturization of the capacitors becomes a problem.

Therefore, those skilled in the art have developed two-transistor capacitor-less (2T0C) DRAM, in which a memory cell usually consists of one read transistor and one write transistor. However, there are also many problems needed to be solved in the structure of the two-transistor capacitor-less (2T0C) DRAM.

Based on this, the following technical solutions are proposed by the embodiments of the disclosure.

The embodiments of the disclosure provide a semiconductor structure. The semiconductor structure includes: a substrate; a semiconductor pillar located on the substrate and a gate pillar located on the semiconductor pillar, in which the semiconductor pillar and the gate pillar both extend in a direction perpendicular to a plane of the substrate; a first word line extending in a first direction parallel to the plane of the substrate and surrounding the semiconductor pillar; and a semiconductor layer located above the semiconductor pillar and at least surrounding a sidewall of the gate pillar.

In the embodiments of the disclosure, the semiconductor pillar at the bottom and the semiconductor layer located thereon are longitudinally distributed. Therefore, when a transistor structure is subsequently formed on the semiconductor pillar and the semiconductor layer, an area occupied by the projections of two transistors on the substrate can be significantly reduced, compared with the case that two transistors are distributed laterally on the substrate, thereby effectively improving the integration level of the semiconductor structure by the embodiments of the disclosure.

In order to make the above purposes, features and advantages of the disclosure more apparent and easy to be understood, specific implementations of the disclosure are described below in detail with reference to the drawings. For ease of description, a schematic diagram may be partially enlarged not to scale during describing the embodiments of the disclosure in detail. The schematic diagram is only illustrative, and should not limit a scope of protection of the disclosure herein.

Figure 2:
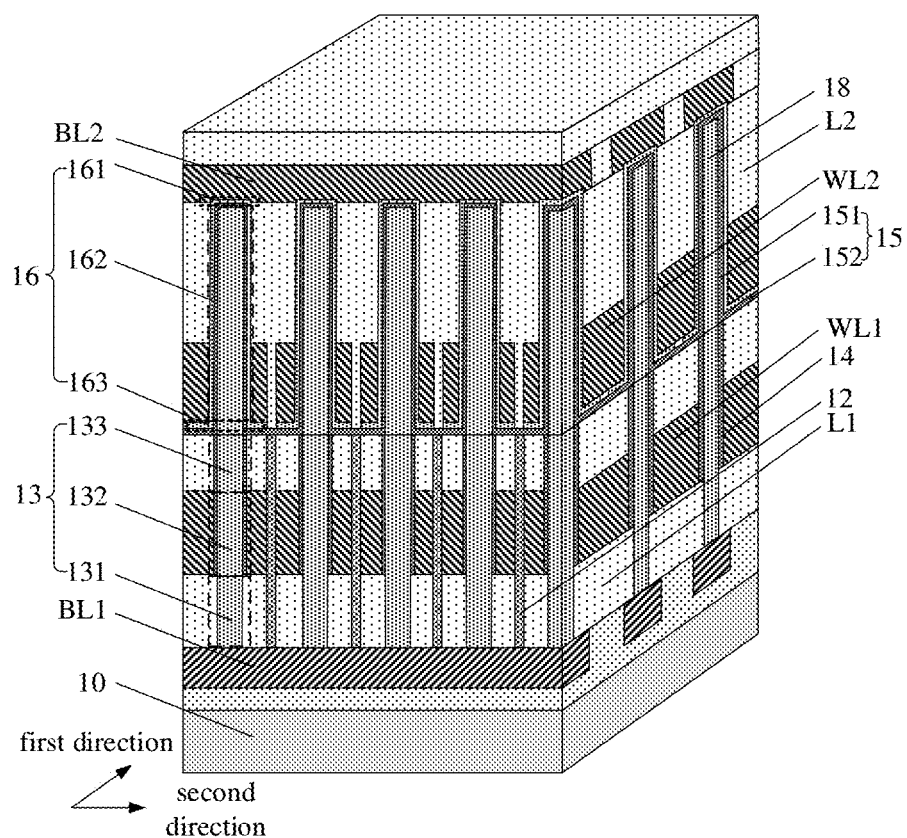
FIG. 2 schematically shows another structure of a semiconductor structure provided by an embodiment of the disclosure.
Figure 3:
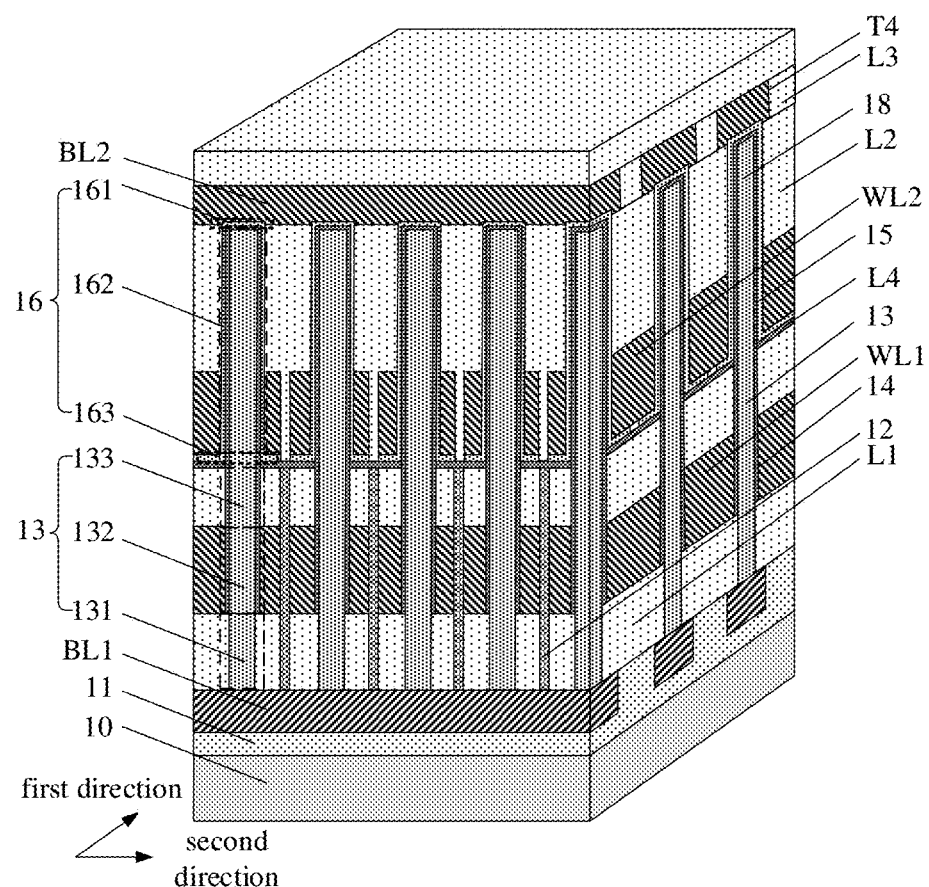
FIG. 3 schematically shows yet another structure of a semiconductor structure provided by an embodiment of the disclosure.

FIG. 1 schematically shows a structure of a semiconductor structure provided by an embodiment of the disclosure. FIG. 2 schematically shows another structure of a semiconductor structure provided by an embodiment of the disclosure. FIG. 3 schematically shows yet another structure of semiconductor structure provided by an embodiment of the disclosure.

An semiconductor structures provided by the embodiments of the disclosure will be further described in detail below with reference to the accompanying drawings.

As shown in FIG. 1, FIG. 2 and FIG. 3, the semiconductor structure includes: a substrate 10; a semiconductor pillar 13 located on the substrate 10 and a gate pillar 18 located on the semiconductor pillar 13, in which the semiconductor pillar 13 and the gate pillar 18 both extend in a direction perpendicular to the plane of substrate 10; a first word line WL1 extending in a first direction parallel to the plane of the substrate 10 and surrounding the semiconductor pillar 13; and a semiconductor layer 16 located on the semiconductor pillar 13 and at least surrounding a sidewall of the gate pillar 18.

In some embodiments, the gate pillar 18 and the semiconductor pillar 13 are in one-to-one correspondence.

The substrate may be a semiconductor substrate and may specifically include at least one elemental semiconductor material (such as silicon (Si) substrate, germanium (Ge) substrate), at least one III-V compound semiconductor material (such as gallium nitride (GaN) substrate, gallium arsenide (GaAs) substrate, indium phosphide (InP) substrate), at least one II-VI compound semiconductor material, at least one organic semiconductor material, or other semiconductor materials known in the art. In a particular embodiment, the substrate is the silicon substrate.

In some embodiments, materials of the semiconductor pillar 13 and the semiconductor layer 16 include at least one or a combination of indium oxide, tin oxide, In—Zn oxide, Sn—Zn oxide, Al—Zn oxide, In—Ga oxide, In—Ga—Zn oxide, In—Al—Zn oxide, In—SnZn oxide, Sn—Ga—Zn oxide, Al—Ga—Zn oxide, or Sn—Al—Zn oxide.

But not limited thereto, the materials of the semiconductor pillar and the semiconductor layer may also include In—Hf—Zn oxide, In—La-Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide; or quaternary metal oxide such as In—Sn—Ga—Zn oxide, In—Hf—Ga—Zn oxide, In—Al—Ga—Zn oxide, In—Sn—Al—Zn oxide, In—Sn—Hf—Zn oxide, In—Hf—Al—Zn oxide, etc.

In some embodiments, a material containing at least indium (In) or zinc (Zn) may be selected as the material for the semiconductor pillar and the semiconductor layer. In particular, the material containing indium (In) and zinc (Zn) are preferred. In addition to the above elements, a material further containing a stabilizer, gallium (Ga) element, may be selected. The stabilizer can reduce electrical characteristic deviation of the finally formed transistor.

Optionally, the materials of the semiconductor pillar and the semiconductor layer include, but are not limited to, indium gallium zinc oxide (IGZO), such as the material with chemical formula of $InGaZnO_4$.

In a specific embodiment, the materials of the semiconductor pillar and the semiconductor layer include $In_xGa_yZn_{1-x-y}O$, where x is greater than or equal to 0 and less than or equal to 1 and y is greater than or equal to 0 and less than or equal to 1.

It can be understood that in an actual operation, part of the semiconductor pillar may be used as a channel region, and the semiconductor layer may be used as a channel region. On the basis, a transistor structure for writing operation and a transistor structure for reading operation may be formed, respectively.

In some embodiments, when an oxide semiconductor material is used for forming the semiconductor pillar and the semiconductor layer, that is, when the oxide semiconductor material is used for forming the channel region of the transistor structure for writing operation and the channel region of the transistor structure for reading operation, it can effectively reduce the leakage current of the two transistor structures, improve the on-off current ratio and current drivability of the two transistor structures, increase an access speed of the semiconductor structure, and reduce power consumption, as the oxide semiconductor material has higher carrier mobility and lower leakage current.

It is to be understood that, in the structure of the two-transistor capacitor-less (2T0C) DRAM, the transistor structure formed based on semiconductor pillar can be used as a write transistor of the semiconductor structure, and the transistor structure formed based on the semiconductor layer can be used as a read transistor of the semiconductor structure. One write transistor and one read transistor constitute one memory cell, which is configured to realize the reading operation of information.

Compared with a semiconductor structure provided with a capacitor structure, the structure provided by the embodiment of the disclosure neither needs additional capacitor manufacturing, thus simplifying the process, nor needs re-writing operation after reading operation, thus reducing power consumption.

In some embodiments, the semiconductor pillar 13 includes a first electrode 131, a first channel region 132, and a second electrode 133 distributed from bottom to top. The first electrode 131, the first channel region 132, and the second electrode 133 are the same in term of conductivity type.

When the material of the semiconductor pillar is indium gallium zinc oxide (IGZO), not only a leakage current of the write transistor structure can be effectively reduced, but also due to the same conductivity type of the first electrode, the first channel region and the second electrode, a floating body effect of the write transistor structure can be effectively prevented.

Herein, the first electrode 131, the first channel region 132 and the second electrode 133 may be used as a first source/drain region, a channel region, and a second source/drain region of the write transistor respectively.

In some embodiments, the semiconductor layer 16 includes a first sub-portion 161, a second sub-portion 162, and a third sub-portion 163 connected to each other. The first sub-portion 161 covers a top surface of the gate pillar 18, the second sub-portion 162 covers a sidewall of the gate pillar 18, and the third sub-portion 163 partially covers an upper surface of the substrate 10 between adjacent gate pillars 18.

Herein, since the semiconductor layer can be used as a channel region of the read transistor, and the second sub-portion of thereof covers (surrounds) the sidewall of the gate pillar, the channel region of the read transistor has a larger channel size compared with a structure that a channel region is only arranged on one side of a gate, thereby effectively preventing the occurrence of the short channel effect by the structure provided by the embodiment of the disclosure.

With further reference to FIG. 1 and FIG. 2, it can be seen that in some embodiments, the semiconductor structure further includes a first gate dielectric layer 14, and a second gate dielectric layer 15.

The first gate dielectric layer 14 is located between the first word line WL1 and the semiconductor pillar 13, and surrounds the first channel region 132 and the second electrode 133.

The second gate dielectric layer 15 includes a first sub-layer 151 and a second sub-layer 152 connected to each other. The first sub-layer 151 is located between the gate pillar 18 and the semiconductor layer 16, covers the top and the sidewall of the gate pillar 18. The second sub-layer 152 covers an upper surface of the substrate 10 between the adjacent gate pillars 18.

With further reference to FIG. 3, it can be seen that in some other embodiments, the semiconductor structure further includes a first gate dielectric layer 14, a second gate dielectric layer 15 and a fourth dielectric layer L4.

The first gate dielectric layer 14 is located between the first word line WL1 and the semiconductor pillar 13, and surrounds the first channel region 132 and the second electrode 133.

The second gate dielectric layer 15 covers the top and the sidewall of the gate pillar 18.

The fourth dielectric layer L4 covers the upper surface of the substrate 10 between adjacent gate pillars 18.

In practices, materials of the first gate dielectric layer and the second gate dielectric layer include, but are not limited to, oxides, nitrides, oxynitride, and other insulating materials, etc. In some specific embodiments, the materials of the first gate dielectric layer and the second gate dielectric layer may be one or a combination of alumina, silicon oxide, silicon nitride, etc.

The process for forming the first gate dielectric layer and the second gate dielectric layer includes, but is not limited to, an atomic layer deposition process and the like.

Since the second gate dielectric layer includes the portion covering the upper surface of the substrate between the adjacent gate pillars, the structure located at lower and around the semiconductor pillar is electrically isolated from the structure located at upper and around the gate pillar, thereby preventing mutual interference between the above structures.

In some embodiments, the semiconductor structure further includes a second word line WL2, a first bit line BL1 and a second bit line BL2.

The second word lines WL2 extends in the first direction, surrounds an end, close to the semiconductor pillar 13 of the second sub-portion 162, and covers the upper surface of the third sub-portion 163.

The first bit line BL1 and the second bit line BL2 extend in a second direction parallel to the plane of the substrate 10 and perpendicular to the first direction. The first bit line BL1 is located below the semiconductor pillar 13 and electrically connected to the lower portion of the semiconductor pillar 13. The second bit line BL2 is located above the semiconductor layer 16 and electrically connected to the first sub-portion 161.

Herein, the second word line can be used as the source region or drain region of the read transistor, while the second bit line can be used as the drain region or source region of the read transistor. In some embodiments, the second word line is used as the source region of the read transistor, and the second bit line is used as the drain region of the read transistor, but is not limited to this. In some other embodiments, the second word line may be used as the drain region of the read transistor, and the second bit line may be used as the source region of the read transistor, which is not specifically limited herein.

In this embodiment, since the second word line surrounds the second sub-portion of the semiconductor layer as the channel region, the contact area between the second word line and the channel region is increased, which is beneficial to reduce a contact resistance between the second word line and the channel region, thereby reducing the power consumption of the read transistor.

In actual operation, the first bit line may be electrically connected to the first electrode of the semiconductor pillar. When an appropriate voltage is applied to the first word line and the write transistor are turned on, by applying an appropriate voltage to the first bit line, the charge can be injected into gate (i.e., the gate pillar) of the read transistor through the semiconductor pillar, and the change in the amount of charges contained in the gate (i.e., the gate pillar) would affect the resistance state of the read transistor, thereby realizing the distinction between "0" and "1" in actual operation.

Herein, the gate of the read transistor is used as a node for information storage, so that a separate process of forming a capacitor structure is unnecessary.

In the process, the charge in the write transistor needs to be injected into the gate pillar of the read transistor through the semiconductor pillar. Therefore, the relative position and the connection relationship between the semiconductor pillar and the gate pillar, as well as material characteristics thereof may affect the transmission speed and efficiency of the charge In an embodiment of the disclosure, as shown in FIG. 1, the top of the semiconductor pillar 13 is electrically connected to the bottom of the gate pillar 18.

Herein, the material of the semiconductor pillar may be an oxide semiconductor material, and the material of the gate pillar may include, but is not limited to, one or more of tungsten (W), copper (Cu), titanium (Ti), tantalum (Ta), titanium nitride (TiN), tantalum nitride (TaN), metal silicide, and metal alloy.

In the embodiment, the top of the second electrode of the semiconductor pillar is electrically connected to the bottom of the gate pillar directly. That is, the source/drain region of the write transistor is electrically connected to the gate of the read transistor directly without using other conductive wires. Compared with a conventional structure in which the source/drain region of the write transistor is electrically connected to the gate of the read transistor through interconnecting wires, the embodiment of the disclosure can effectively shorten the charge flow path when the charge in the write transistor is injected into the gate of the read transistor, thereby effectively improving the transmission speed and efficiency of information of the semiconductor structure.

In another embodiment of the disclosure, as shown in FIG. 2, the orthographic projection of the semiconductor pillar is at least partially overlapped with the orthographic projection of the gate pillar on the plane of the substrate. In addition, the material of the gate pillar is the same as that of the semiconductor pillar.

In the embodiment, the orthographic projection of the semiconductor pillar is at least partially overlapped with the orthographic projection of the gate pillar on the plane of the substrate. That is, the orthographic projection of the write transistor is at least partially overlapped with the orthographic projection of the read transistor on the plane of the substrate, so that the memory cell structure composed of one write transistor and one read transistor occupies less surface area of the substrate, which means that on the substrate with the same plane area, the semiconductor structure provided by the embodiment of the disclosure can be arranged with more memory cells. That is, the semiconductor structure of the embodiment of the disclosure can have higher integration.

It is to be understood that, when the orthographic projection of the semiconductor pillar is completely overlapped with the orthographic projection of the gate pillar on the plane of the substrate overlap, that is, when the orthographic projection of the write transistor is completely overlapped with the orthographic projection of the read transistor on the plane of the substrate, the semiconductor structure provided by the embodiment of the disclosure can be arranged with a better amount of memory cells, that is, the semiconductor structure of the embodiment of the disclosure can have a better integration.

In addition, a conventional structure in which the source/drain region of the write transistor is formed by a semiconductor material and the gate of the read transistor is formed by a metal material, the material of the gate pillar is the same as that of the semiconductor pillar in the embodiment of the disclosure, that is, the material of the source/drain region of the write transistor is the same as that of the gate of the read transistor, so that when the source/drain region of the write transistor is electrically connected to the gate of the read transistor, there is no need to worry about an increase of contact resistance caused by the effect of metal-induced gap states between the metal material and the semiconductor material, thereby effectively reducing the power consumption of the whole semiconductor structure.

It is to be understood that, materials of the semiconductor pillar and the gate pillar may include at least one or a combination of indium oxide, tin oxide, In—Zn oxide, Sn—Zn oxide, Al—Zn oxide, In—Ga oxide, In—Ga—Zn oxide, In—Al—Zn oxide, In—Sn—Zn oxide, Sn—Ga—Zn oxide, Al—Ga—Zn oxide, or Sn—Al—Zn oxide.

In some embodiments, the materials of the semiconductor pillar and the gate pillar may be an oxide semiconductor material, such as $InGaZnO_4$ material.

In a specific embodiment, the materials of the semiconductor pillar and the gate pillar include $In_xGa_yZn_{1-x-y}O$, where x is greater than or equal to 0 and less than or equal to 1 and y is greater than or equal to 0 and less than or equal to 1.

In yet another embodiment in the disclosure, as shown in FIG. 3, the gate pillar 18 and the semiconductor pillar 13 are electrically connected directly.

In this embodiment, the gate pillar and the semiconductor pillar which are electrically connected directly form an integrated structure. That is, the channel region amd the source/drain region of the write transistor as well as the gate of the read transistor form the integrated structure. That is, the source/drain region of the write transistor and the gate of the read transistor can be electrically connected directly without using other conductive wires. Compared with a conventional structure in which the source/drain region of write transistor is electrically connected to the gate of read transistor through interconnecting wires, the embodiment of the disclosure can effectively shorten the charge flow path when the charge in the write transistors is injected into the gate of the read transistor, thereby effectively improving the transmission speed and efficiency of information of the semiconductor structure. In addition, when the charge in the write transistor needs to be injected into the gate of the read transistor through the source/drain region, it can effectively prevent the semiconductor structure from generating more heat during use, as there is no contact resistance in the integrated structure between the write transistor and the read transistor, thereby effectively improving the performance of the semiconductor structure.

In addition, in an actual process, the structure composed of the gate pillar and the semiconductor pillar can be formed in the same process operation, which significantly reduces the complexity of the process and is beneficial to the improvement of production efficiency.

In some embodiments, as shown in FIG. 1 and FIG. 2, it can be seen that the semiconductor structure further includes a first dielectric layer L1 located on the substrate 10 and a second dielectric layer L2 located on the first dielectric layer L1. The semiconductor pillar 13 and the first word line WL1 are located in the first dielectric layer L1, while the gate pillar 18, the semiconductor layer 16 and the second word line WL2 are located in the second dielectric layer L2.

Optionally, the semiconductor structure further includes a word line isolation structure 12 extending in the first direction. The word line isolation structure 12 is located between two adjacent first word lines WL1 to isolate the adjacent first word lines WL1.

In this embodiment, the word line isolation structure is located in the first dielectric layer. The material of the word line isolation structure may include, but is not limited to, oxide, nitride, oxynitride and the like, specifically, at least one or a combination of, for example, silicon oxide, silicon nitride, silicon oxynitride and the like.

Figure 4:
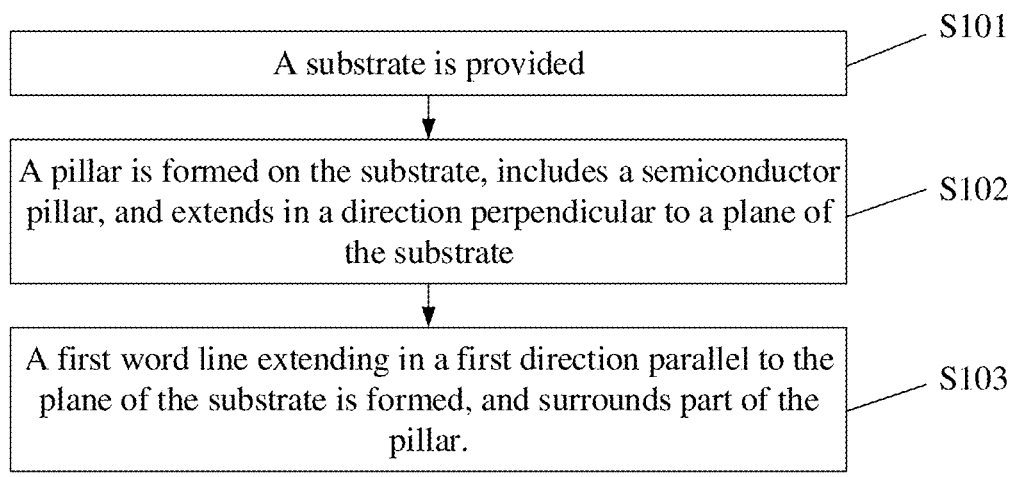
FIG. 4 shows a flowchart of a method for manufacturing a semiconductor structure provided by an embodiment of the disclosure.

The embodiments of the disclosure also provide a method for manufacturing a semiconductor structure. As shown in FIG. 4, the method includes the following operations.

In S101, a substrate is provided.

In S102, a pillar is formed on the substrate. The pillar includes a semiconductor pillar, and extends in a direction perpendicular to the plane of the substrate.

In S103, a first word line is formed. The first word line extends in a first direction and surrounds part of the pillar. The first direction is parallel to a plane of the substrate.

The method for manufacturing a semiconductor structure provided by the embodiments of the disclosure will be further described in detail below with reference to the accompanying drawings.

FIGS. 5 to 22 are process flow diagrams during a method for manufacturing a semiconductor structure provided by an embodiment of the disclosure. FIG. 23 schematically shows another structure of a semiconductor structure provided by an embodiment of the disclosure.

Figure 5:
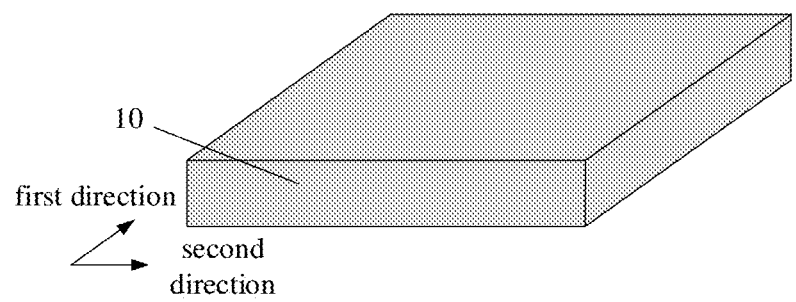
FIGS. 5 to 22 are process flow diagrams during a method for manufacturing a semiconductor structure provided by an embodiment of the disclosure.

First, S101 is performed. As shown in FIG. 5, a substrate is provided.

Herein, the substrate may be a semiconductor substrate, and specifically includes at least one elemental semiconductor material (such as silicon (Si) substrate, germanium (Ge) substrate), at least one III-V compound semiconductor material (such as gallium nitride (GaN) substrate, gallium arsenide (GaAs) substrate, indium phosphide (InP) substrate, etc.), at least one II-VI compound semiconductor material, at least one organic semiconductor material, or other semiconductor materials known in the art. In a particular embodiment, the substrate is the silicon substrate.

Figure 10:
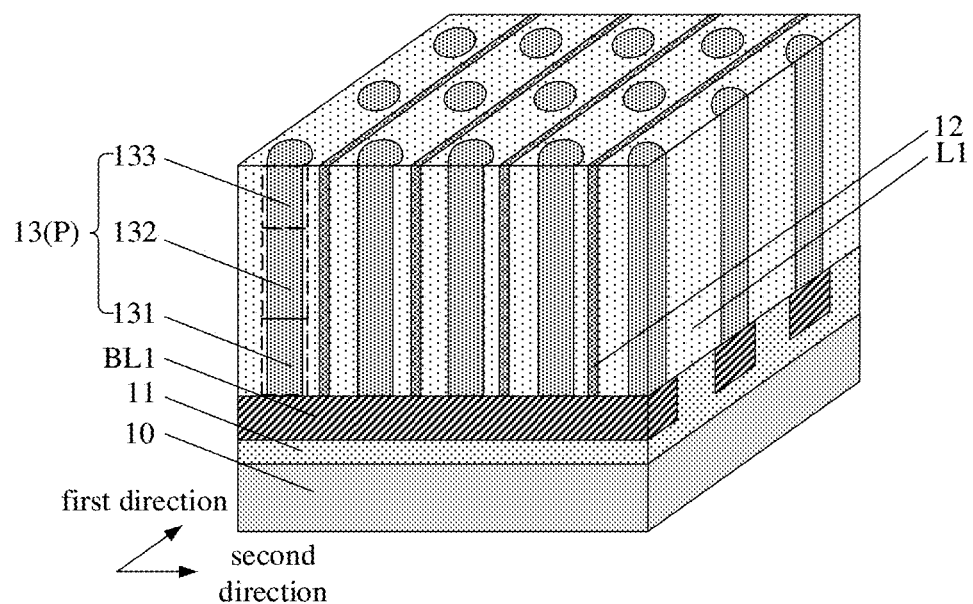

Next, S102 is performed. As shown in FIG. 10, a pillar is formed on the substrate. The pillar includes a semiconductor pillar, and extends in a direction perpendicular to the plane of the substrate.

Figure 6:
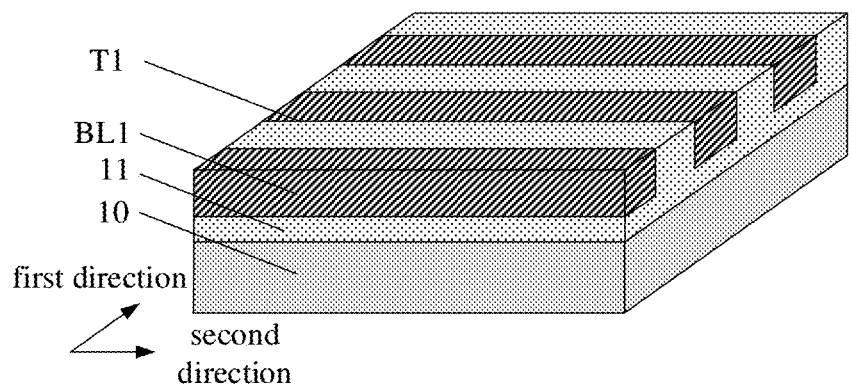

In some embodiments, as shown in FIG. 6, before the semiconductor pillar 13 is formed on the substrate 10, the method further includes the following operations.

An insulating layer 11 is formed on the substrate 10.

An etching process is performed on the insulating layer 11, so as to form a plurality of first trenches T1 extending in a second direction in the insulating layer 11. The second direction is parallel to the plane of the substrate 10 and perpendicular to the first direction.

The plurality of first trenches T1 are filled with a conductive material, to form a plurality of first bit lines BL1 extending in the second direction.

Herein, the material of the insulating layer includes, but is not limited to, oxide, nitride, oxynitride and the like. In some specific embodiments, the material of the insulating layer may include, but is not limited to, silicon oxide and the like.

In actual operation, the insulating layer and the conductive material may be formed by one or more thin film deposition process. Specifically, the thin film deposition process includes, but is not limited to, a chemical vapor deposition (CVD) process, a plasma enhanced chemical vapor deposition (PECVD) process, an atomic layer deposition (ALD) process, or a combination thereof.

Figure 7:
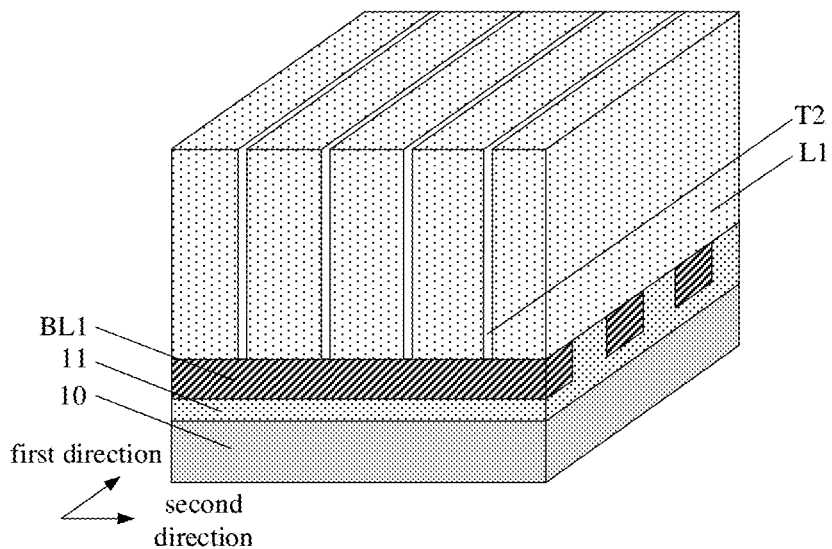
Figure 8:
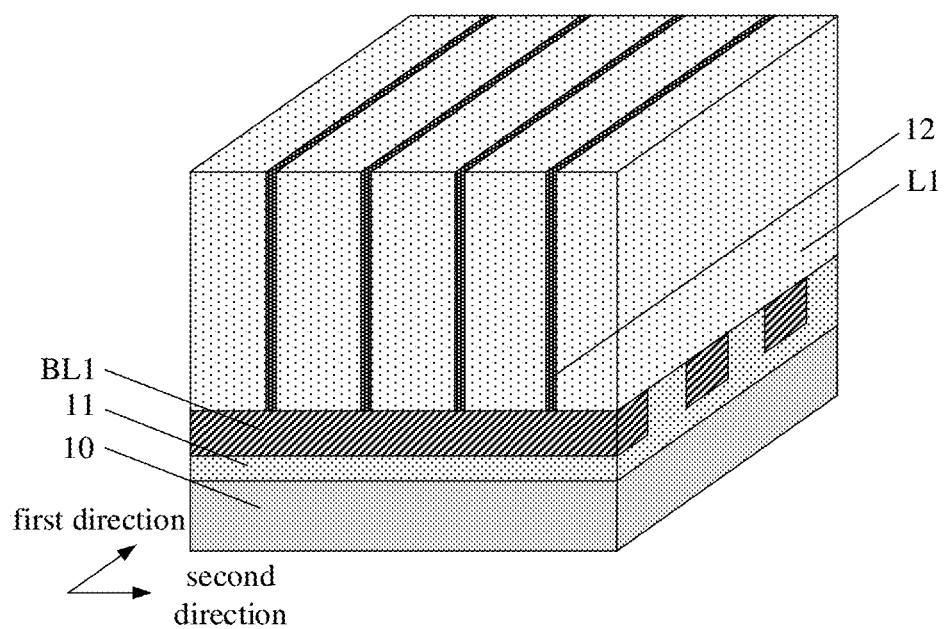

In some embodiments, as shown in FIGS. 7 and 8, after filling the plurality of first trenches T1 with a conductive material to form a plurality of first bit lines BL1 extending in the second direction, the method further includes the following operations.

A first dielectric layer L1 is formed.

The first dielectric layer L1 is etched to form a plurality of second trenches T2 extending in the first direction in the first dielectric layer L1.

The plurality of second trenches T2 are filled with an insulating material to form a plurality of word line isolation structures 12 extending in the first direction.

The material of the first dielectric layer includes, but is not limited to, one or an combination of oxide, nitride, oxynitride, another insulating material and the like. Specifically, the material of the first dielectric layer may include, but is not limited to, silicon oxide, silicon nitride and the like.

In addition, the process for forming the first dielectric layer may be the same as or different from the process for forming the insulating layer, which is not specifically limited herein.

Figure 9:
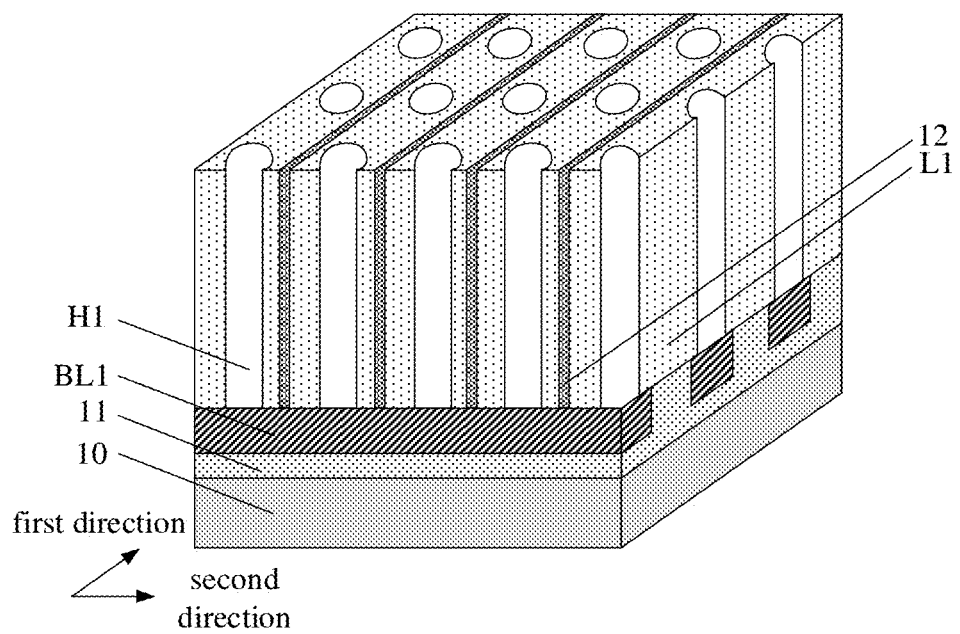

In some embodiments, as shown in FIGS. 9 to 10, before forming the pillar on the substrate, the method further includes the following operations.

The first dielectric layer L1 is etched to form a plurality of first channel holes H1. Each of the first channel hole H1 exposes the first bit line BL1.

Each of The first channel holes H1 is filled with a semiconductor material to form the pillar P. The pillar includes the semiconductor pillar 13.

In practices, the plurality of first channel holes H1 may be formed by etching the first dielectric layer L1 from top to bottom. The plurality of first channel hole H1 are located in the first dielectric layer L1 between two adjacent word line isolation structures 12.

In some embodiments, the semiconductor pillar 13 may include a first electrode 131, a first channel region 132, and a second electrode 133 distributed from bottom to top. The first electrode 131, the first channel region 132, and the second electrode 133 have the same conductivity type. It is to be understood that, the first electrode 131, the first channel region 132 and the second electrode 133 may be used as the first source/drain region, the channel region and the second source/drain region of the transistor respectively.

In the embodiment, the material of the semiconductor pillar includes at least one or a combination of indium oxide, tin oxide, In—Zn oxide, Sn—Zn oxide, Al—Zn oxide, In—Ga oxide, In—Ga—Zn oxide, In—Al—Zn oxide, In—Sn—Zn oxide, Sn—Ga—Zn oxide, Al—Ga—Zn oxide, and Sn—Al—Zn oxide.

Optionally, the material of the semiconductor pillar includes, but is not limited to, indium gallium zinc oxide (IGZO), such as the material with a chemical formula of $InGaZnO_4$.

In a specific embodiment, the material of the semiconductor pillars includes $In_xGa_yZn_{1-x-y}O$, where x is greater than or equal to 0 and less than or equal to 1, and y is greater than or equal to 0 and less than or equal to 1.

It is to be understood that, in actual operation, the transistor structure based on the semiconductor pillar may be subsequently formed by forming a control gate line, such as a word line structure, on part of the sidewall of the semiconductor pillar to control turn-on or turn-off of the channel region. When the material of the semiconductor pillar is indium gallium zinc oxide (IGZO), that is when the material of the channel region of the transistor structure is indium gallium zinc oxide (IGZO), not only a leakage current of the transistor structure can be effectively reduced, but also due to the same conductivity type of the first electrode, the first channel region and the second electrode, a floating body effect of the transistor structure can be effectively prevented.

It is to be understood that, in the embodiment, the transistor structure formed based on the semiconductor pillar can be used as the write transistor of the memory.

Figure 11:
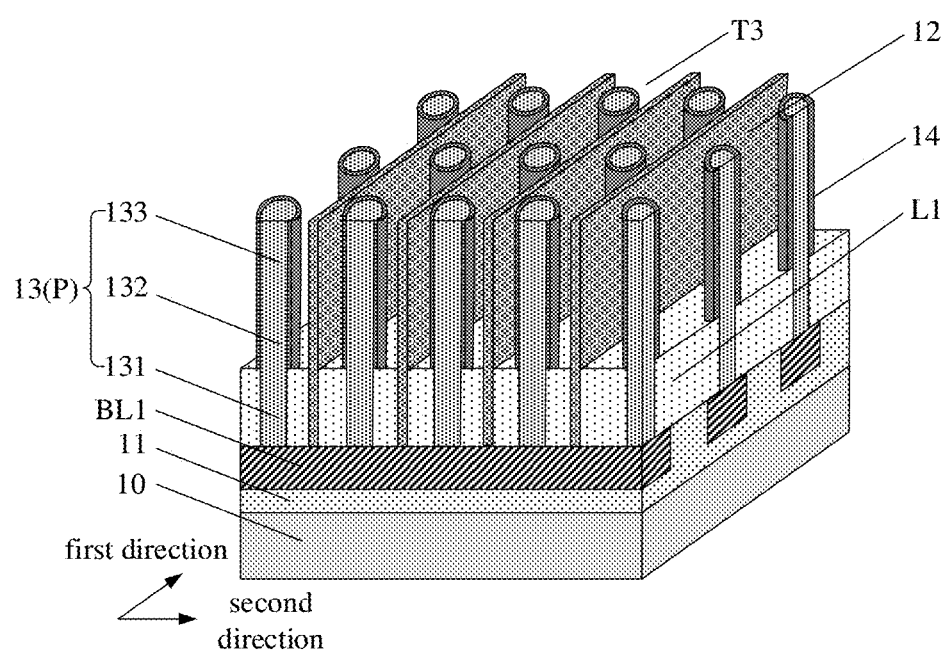
Figure 12:
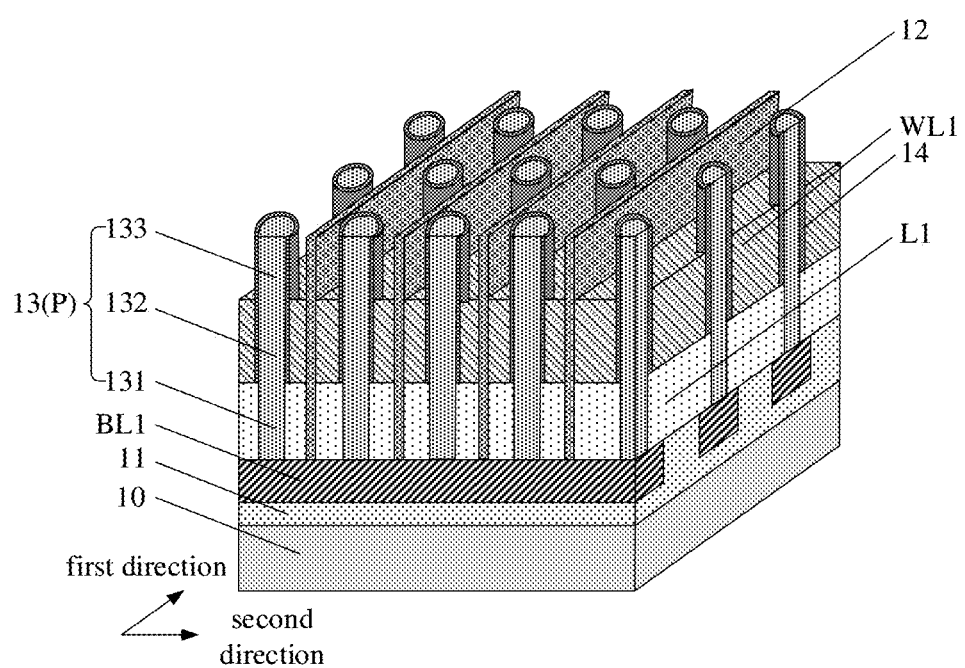

Finally, S103 is performed. As shown in FIGS. 11 and 12, a first word line WL1 is formed, extends in a first direction, and surrounds part of the pillars P. The first direction is parallel to the plane of the substrate.

In some embodiments, the operation that the first word line WL1 is formed, extends in a first direction parallel to the plane of the substrate 10, includes the following operations.

A plurality of third trenches T3 extending in the first direction are formed. Each of the third trenches is located between two adjacent word line isolation structures 12.

A first gate dielectric layer 14 is formed in the third trench T3. The first gate dielectric layer 14 surrounds part of the semiconductor pillar 13.

A first word line WL1 is formed in the third trench T3. The first word line WL1 surrounds part of the first gate dielectric layer 14.

In some specific embodiments, the forming the third trench T3, includes the following operation.

The third trench T3 extending in the first direction is formed by removing part of the first dielectric layer L1. The third trench T3 is located between two adjacent word line isolation structures 12. The bottom of the third trench T3 is flush with the upper surface of the first electrode 131.

It is to be understood that, in actual operation, the first gate dielectric layer 14 surrounds the sidewalls of the first channel region 132 and the second electrode 133 in the semiconductor pillar 13. The upper surface of the first word line WL1 is flush with the upper surfaces of the first channel regions 132.

Figure 13:
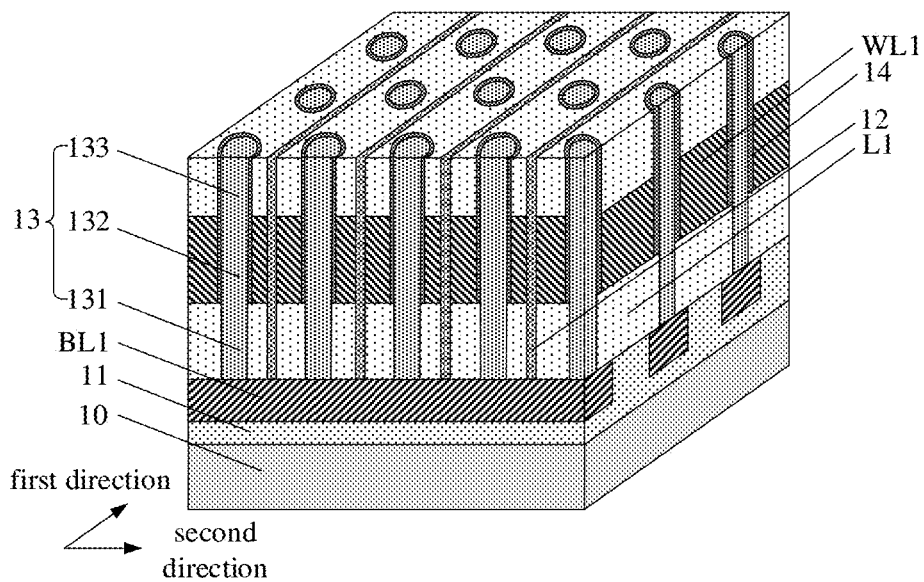
Figure 14:
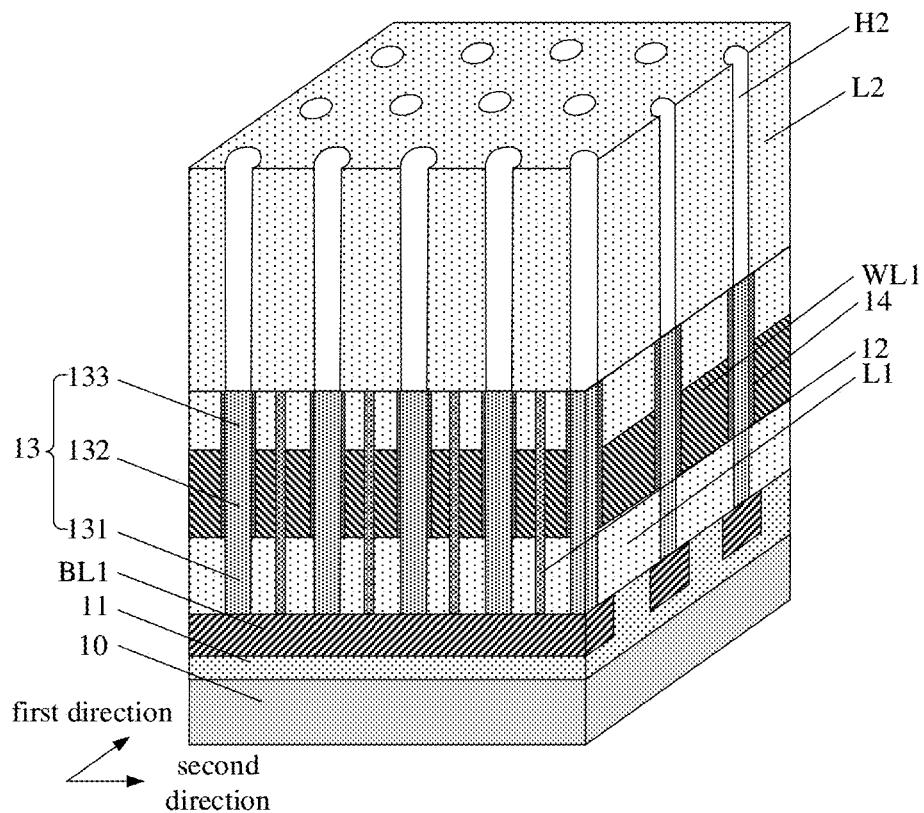
Figure 15:
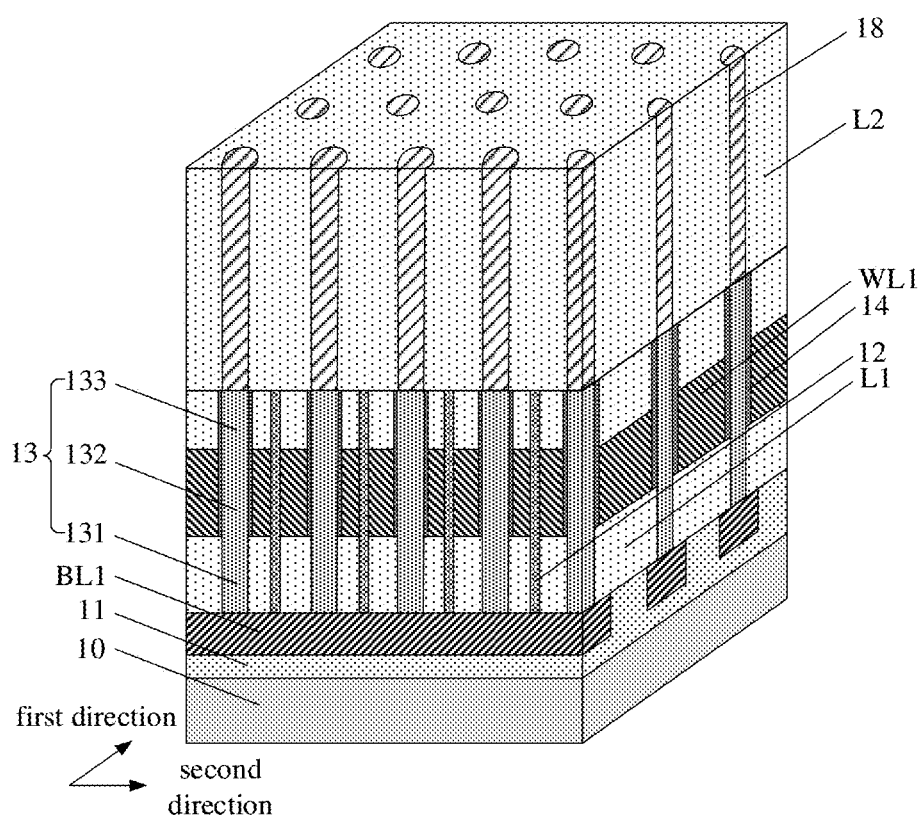
Figure 16:
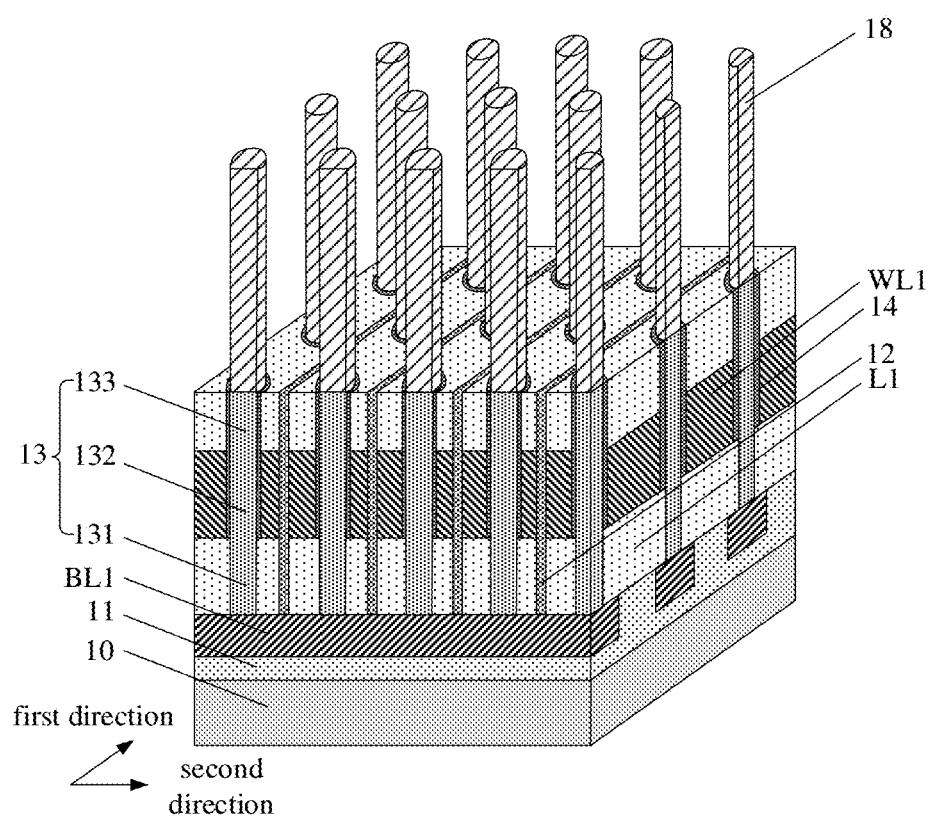
Figure 17:
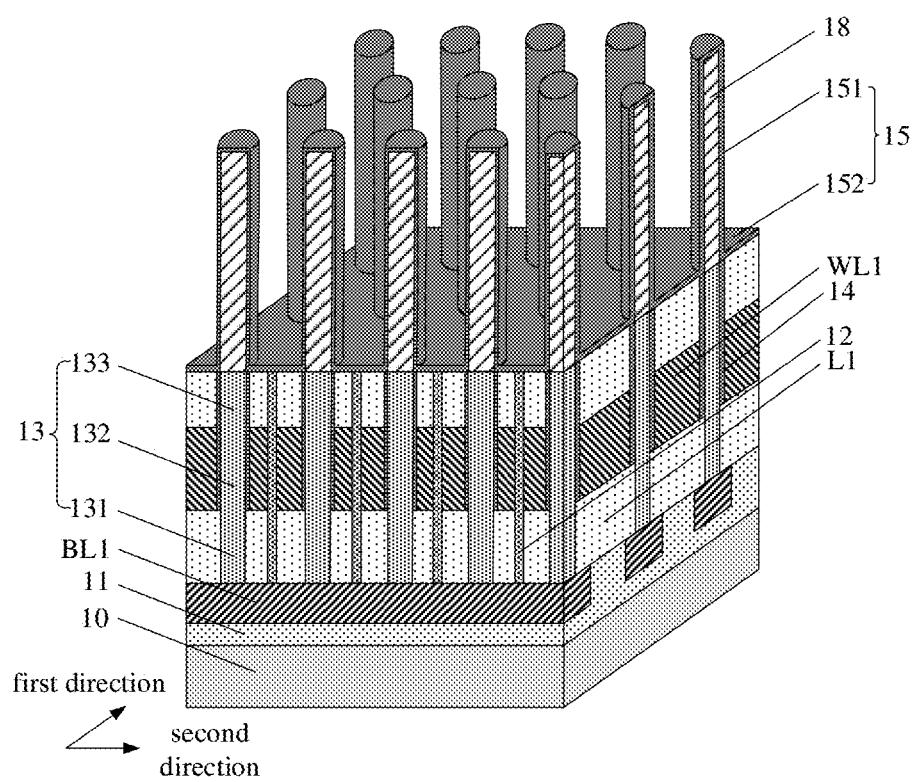
Figure 18:
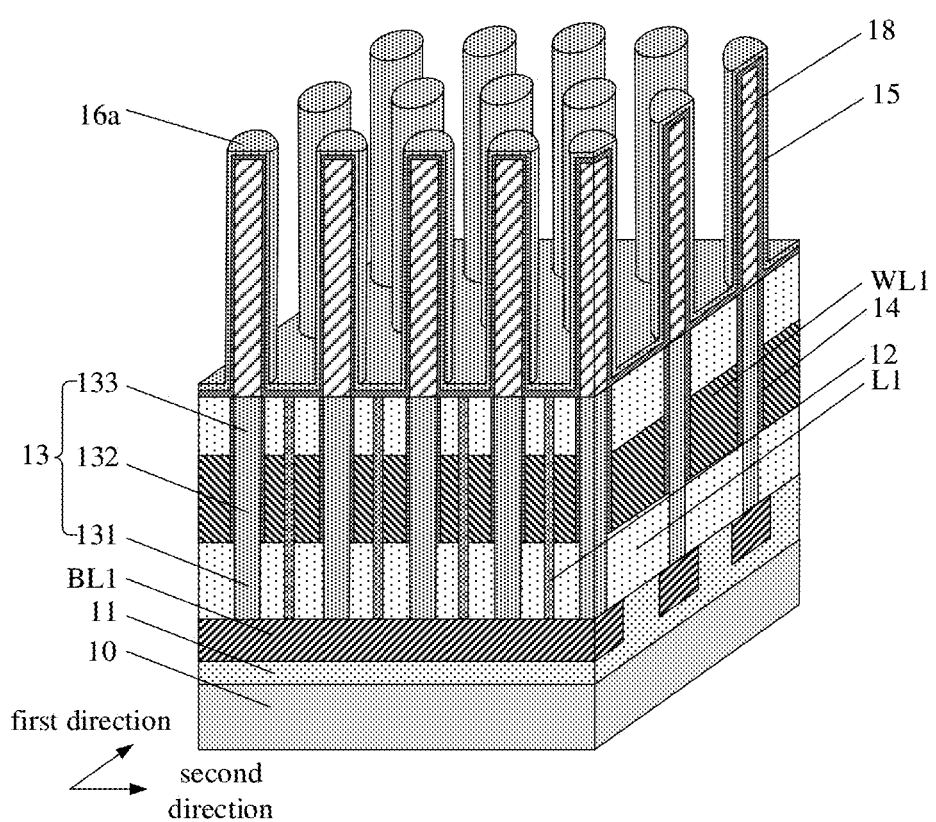

In some embodiments, as shown in FIG. 13, after forming the first word line WL1, the method further includes the following operations.

The first dielectric layer L1 is further filled on the first word line WL1 and in a gap between the semiconductor pillars 13, so that the top surface of the first dielectric layer L1 is flush with the upper surface of the second electrode 133 of the semiconductor pillar.

By doing so, the plurality of transistor structures are formed in the first dielectric layer. It is to be understood that, the multiple transistor structures can be used as the write transistors of the memory.

In some embodiments, as shown in FIG. 16 to FIG. 20, after forming the first word line WL1, the method further includes the following operations. The gate pillar 18 is formed right on the semiconductor pillar 13, and the gate pillar 18 extends in the direction perpendicular to the plane of the substrate 10.

The semiconductor layer 16 is formed, and at least surrounds a sidewall of the gate pillar 18.

In some embodiments, as shown in FIG. 14 to FIG. 20, the forming gate pillars 18 right on the semiconductor pillars 13 includes the following operations.

A second dielectric layer L2 is formed and etched to form a plurality of second channel holes H2 in the second dielectric layer L2. The second channel hole H2 exposes the top of the semiconductor pillar 13.

The gate pillar 18 is formed in the second channel hole H2.

After the formation of the gate pillars 18, the method further includes the following operations.

The Top surface and the sidewall of the gate pillar 18 are exposed.

A second gate dielectric layer 15 is deposited. The second gate dielectric layer 15 includes a portion surrounding the sidewall and the top of the gate pillar 18, and a portion covering the upper surface of the first dielectric layer L1.

A semiconductor material layer 16a and a word line material layer WL2a are sequentially formed on the second gate dielectric layer 15. The semiconductor material layer 16a is conformal with the second gate dielectric layers 15. The word line material layer WL2a fills a gap between the adjacent semiconductor material layers 16a.

The semiconductor material layer 16a and the word line material layer WL2a are etched to respectively form the semiconductor layers 16 and a plurality of second word lines WL2 extending in the first direction.

In actual operation, after the gate pillar 18 is formed in the second channel hole H2, the top surface and the sidewall of the gate pillar 18 may be exposed by removing the second dielectric layer L2. In a subsequent process, after the semiconductor material layer 16a and the word line material layer WL2a are formed sequentially on the second gate dielectric layer 15, the semiconductor layer 16 and the plurality of second word line WL2 extending in the first direction may be respectively formed by removing part of the semiconductor material layer 16a and the word line material layer WL2a located on the word line isolation structure 12.

Herein, the material of the gate pillar may include, but is not limited to, one or more of tungsten (W), copper (Cu), titanium (Ti), tantalum (Ta), titanium nitride (TiN), tantalum nitride (TaN), metal silicide, metal alloy and so on.

In actual operation, the material of the first gate dielectric layer may be the same as or different from that of the second gate dielectric layer. Optionally, materials of the first gate dielectric layer and the second gate dielectric layer include, but are not limited to, oxides, nitrides, oxynitride, other insulating materials, etc. In some specific embodiments, the materials of the first gate dielectric layer and the second gate dielectric layer may be one or a combination of alumina, silicon oxide, silicon nitride, etc.

The process for forming the first gate dielectric layer and the second gate dielectric layer includes, but is not limited to, an atomic layer deposition process and the like.

In the embodiment, since the second gate dielectric layer includes a portion covering the upper surfaces of the first dielectric layer and the word line isolation structure between the adjacent gate pillars, an effect of electrical isolation can be realized between a structure located at the lower portion and around the semiconductor pillar and a structure located at the upper portion and around the gate pillar, thereby preventing mutual interference between the above structures.

Figure 19:
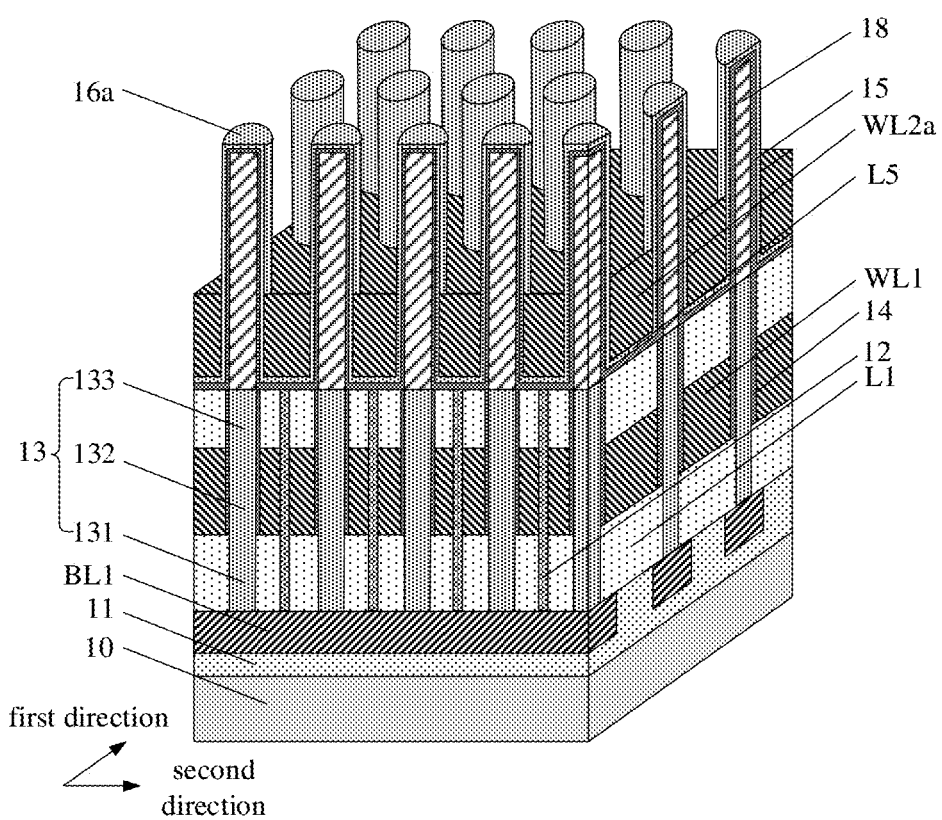

Optionally, in some embodiments, as shown in FIG. 19, after depositing the semiconductor material layer 16a and before forming the word line material layer WL2a, the method may further include the following operations.

The semiconductor material layer 16a is etched along the second direction, to remove part of the semiconductor material layer 16a between the gate pillars 18, so as to form a plurality of gaps extending along the second direction between the gate pillars 18.

A fifth dielectric layer L5 is filled in each of the gaps.

By performing the etching process on the semiconductor material layer twice, the semiconductor layers located around each gate pillar can be independent of each other. Even if it is necessary to form other material layers for constituting the transistor structures on the basis of the semiconductor layers, the finally formed transistor structures can maintain their independence.

Figure 20:
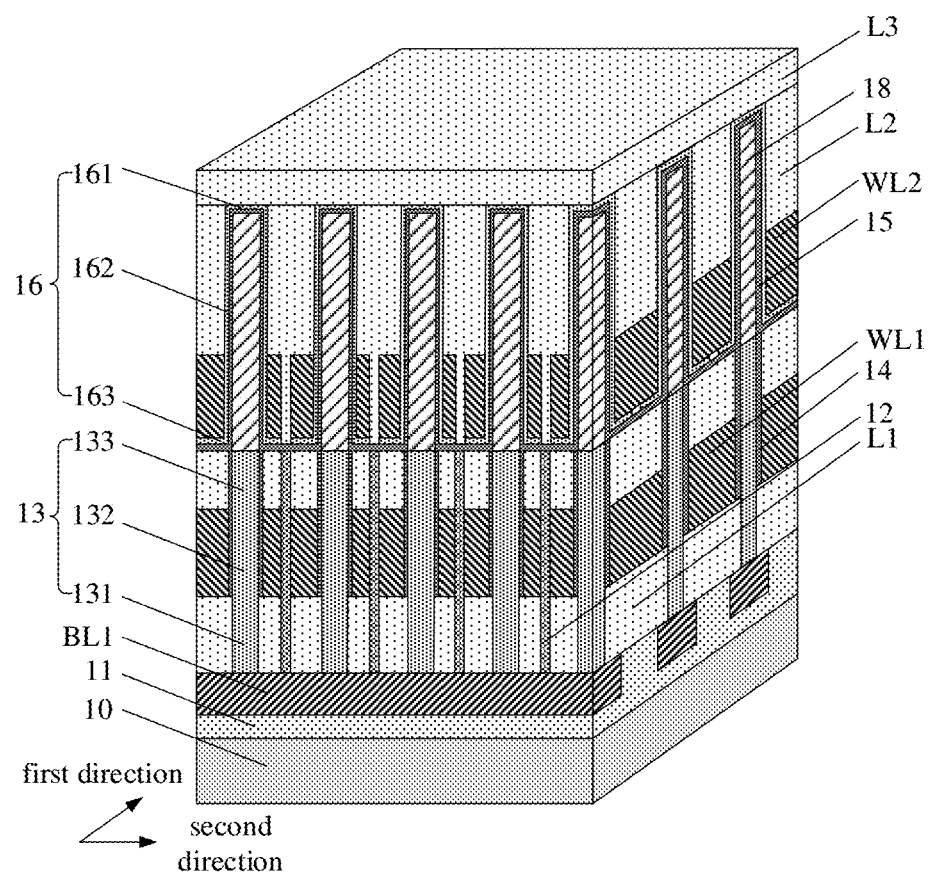
Figure 21:
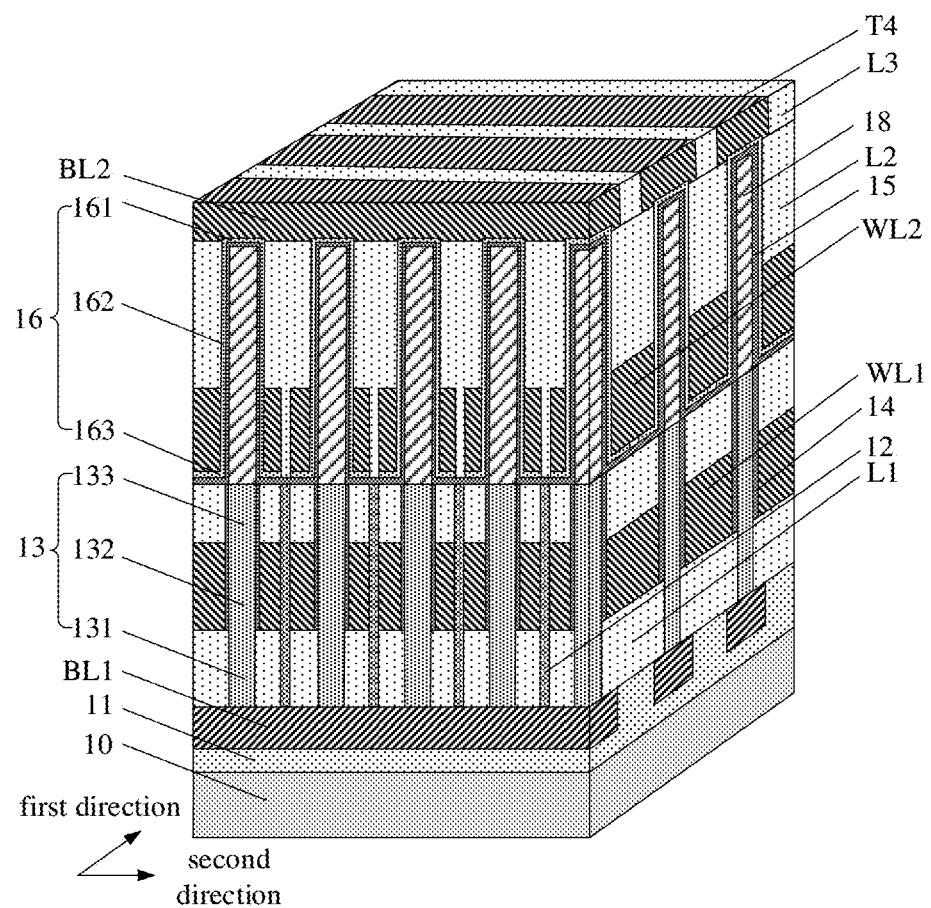

In some embodiments, as shown in FIGS. 20 and 21, after forming the semiconductor layer 16, the method further includes the following operations.

A third dielectric layer L3 is formed.

The third dielectric layer L3 is etched to form a fourth trench T4 extending in a second direction. The upper surface of the semiconductor layer 16 is exposed by the fourth trench T4.

A second bit line BL2 is formed in the fourth trench T4.

By doing so, the plurality of transistor structures are formed in the second dielectric layer. The gate pillar may be used as the gate of the transistor structure, the semiconductor layer may be used as the channel region of the transistor structure, the second word line may be used as the source region or drain region of the read transistor, and the second bit line may be used as the drain region or the source region of the transistor structure.

It is to be noted that, when the second word line is used as the source region of the transistor structure, the second bit line is used as the drain region of the transistor structure, which is not limited to this. In some other embodiments, the second word line may also be used as the drain region of the read transistor, and the second bit line may be used as the source region of the read transistor, which can be flexibly adjusted in actual operation and is not specifically limited herein.

In the embodiment, since the second word line surrounds part of the semiconductor layer as the channel regions, a contact area between the second word line and the channel region is increased, which is beneficial to reduce a contact resistance between the second word line and the channel region, thereby reducing the power consumption of the transistor structure.

It is to be understood that, the multiple transistor structures can be used as the read transistors of the memory.

It is to be understood that, in the embodiment, the top of the second electrode of the semiconductor pillar is electrically connected to the bottom of the gate pillar directly. That is, the source/drain region of the write transistor is electrically connected to the gate of the read transistor directly without using other conductive wires. Compared with a conventional structure in which the source/drain region of the write transistor is electrically connected to the gate of read transistor through interconnecting wires, the embodiment of the disclosure can effectively shorten the charge flow path when the charge in the write transistors is injected into the gate of the read transistor, thereby effectively improving the transmission speed and efficiency of information of the semiconductor structure.

Figure 22:
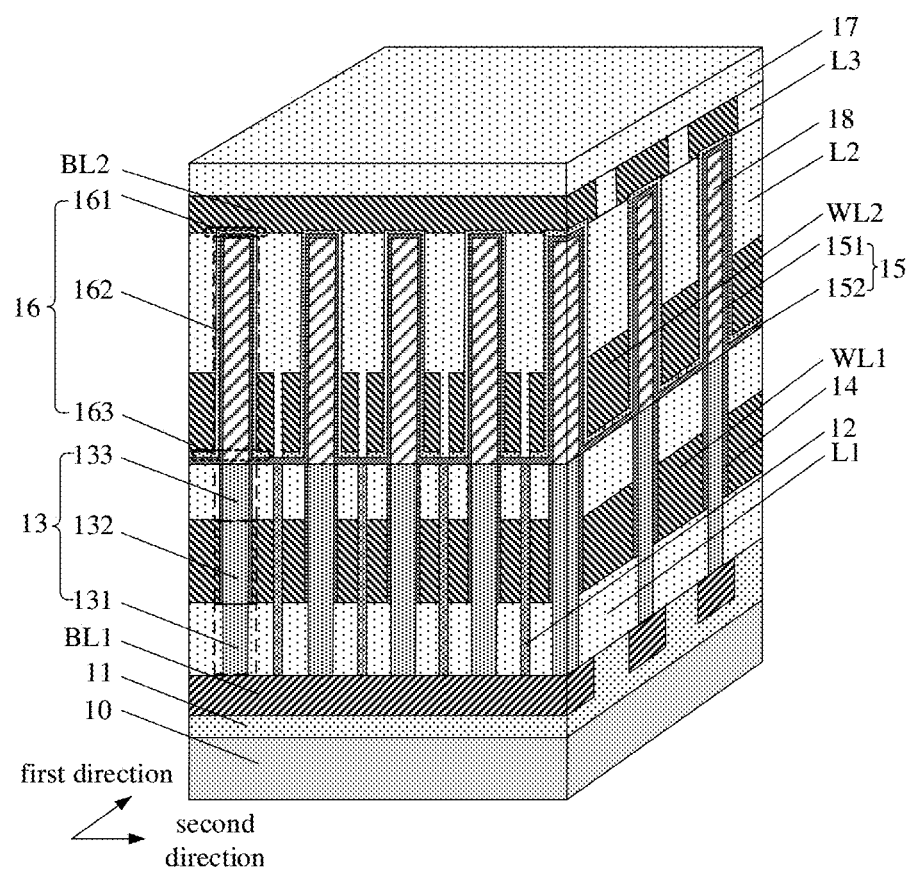
Figure 23:
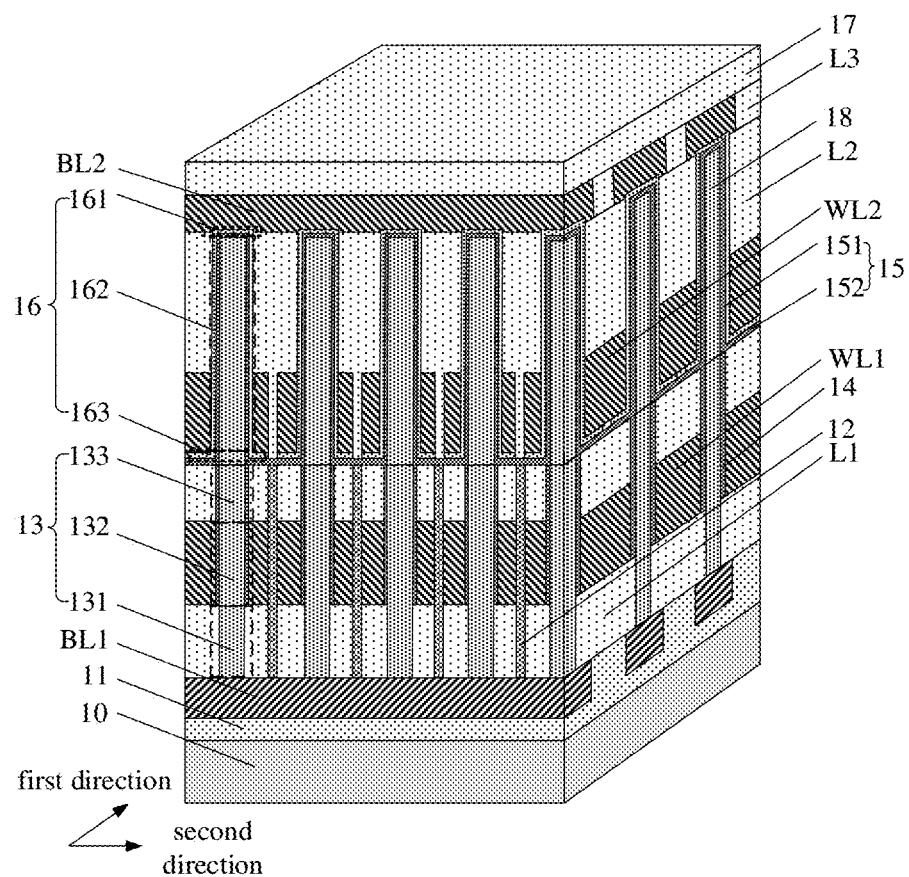
FIG. 23 schematically shows another structure of a semiconductor structure provided by an embodiment of the disclosure.

Optionally, as shown in FIG. 22, after forming the second bit line BL2, the method further includes forming an insulating layer 17 on the second bit line BL2. The insulating layer 17 is used to protect the second bit line BL2.

As shown in FIG. 23, the disclosure also provides another semiconductor structure. The manufacturing process for this semiconductor structure is substantially the same as that of the semiconductor structure provided in FIGS. 5 to 22, except for the material arrangement between the gate pillar and the semiconductor pillar.

In the embodiment, materials of the semiconductor pillar and the gate pillar include at least one or a combination of indium oxide, tin oxide, In—Zn oxide, Sn—Zn oxide, Al—Zn oxide, In—Ga oxide, In—Ga—Zn oxide, In—Al—Zn oxide, In—Sn—Zn oxide, Sn—Ga—Zn oxide, Al—Ga—Zn oxide, or Sn—Al—Zn oxide.

Optionally, the material of the gate pillar may be the same as that of the semiconductor pillar. In some embodiments, the materials of the semiconductor pillar and the gate pillars may both be an oxide semiconductor material, such as $InGaZnO_4$ material.

It is to be understood that, in the embodiment, a transistor structure formed on the basis of the semiconductor pillar can be used as the write transistor of the semiconductor structure, while a transistor structure formed on the basis of the semiconductor layer can be used as the read transistor of the semiconductor structure. Then, one write transistor and one read transistor constitute a memory cell configured to perform a read operation of information.

Compared with a semiconductor structure provided with capacitor structures, there is no need to additionally manufacture capacitors during the manufacture of the structure provided by the embodiments of the disclosure, and thus the process is simple. In addition, there is no need for rewriting operation after reading during the use of the structure, and thus the power consumption is reduced.

In addition, in the embodiment, the orthographic projection of the semiconductor pillar is at least partially overlapped with that of the gate pillar on the plane of the substrate. That is, the orthographic projection of the write transistor is at least partially overlapped with that of the read transistor on the plane of the substrate. Therefore, the memory cell structure composed of one write transistor and one read transistor occupies less surface area of the substrate, which means that on the same plane area of the substrate, the semiconductor structure provided by the embodiment of the disclosure can form more memory cells.

That is, the semiconductor structure of the embodiment of the disclosure can have higher integration.

It is to be understood that, when the orthographic projection of the semiconductor pillar is completely overlapped with that of the gate pillar on the plane of the substrate, that is, the orthographic projection of the write transistor is completely overlapped with that of the read transistor on the plane of the substrate, the semiconductor structure provided by the embodiment of the disclosure can form a better amount of memory cells, that is, the semiconductor structure of the embodiment of the disclosure can have a better integration.

In addition, a conventional structure in which the source/drain region of the write transistor is formed by a semiconductor material and the gate of the read transistor is formed by a metal material, the material of the gate pillar is the same as that of the semiconductor pillar in the embodiment of the disclosure, that is, the material of the source/drain region of the write transistor is the same material as that of the read transistor, so that when the source/drain region of the write transistor is electrically connected to the gate of the read transistor, there is no need to worry about an increase of contact resistance caused by the effect of gate-induced gap states between the metal material and the semiconductor material, thereby effectively reducing the power consumption of the whole semiconductor structure.

In addition to the arrangement of the foregoing embodiment, in another embodiment of the disclosure, the semiconductor structure for information processing purposes may be obtained in other ways. Unlike the foregoing embodiment, in this embodiment, the pillar includes two parts, namely a semiconductor pillar and a gate pillar, which are formed in a same process operation.

FIGS. 24 to 29 are process flow diagrams during a method for manufacturing a semiconductor structure provided by another embodiment of the disclosure.

The method for manufacturing a semiconductor structure provided by another embodiment of the disclosure is described in detail with reference to accompany drawings.

In the embodiment, the material of the substrate may be the same as or different from that in the foregoing embodiment, which is not specifically limited.

Figure 24:
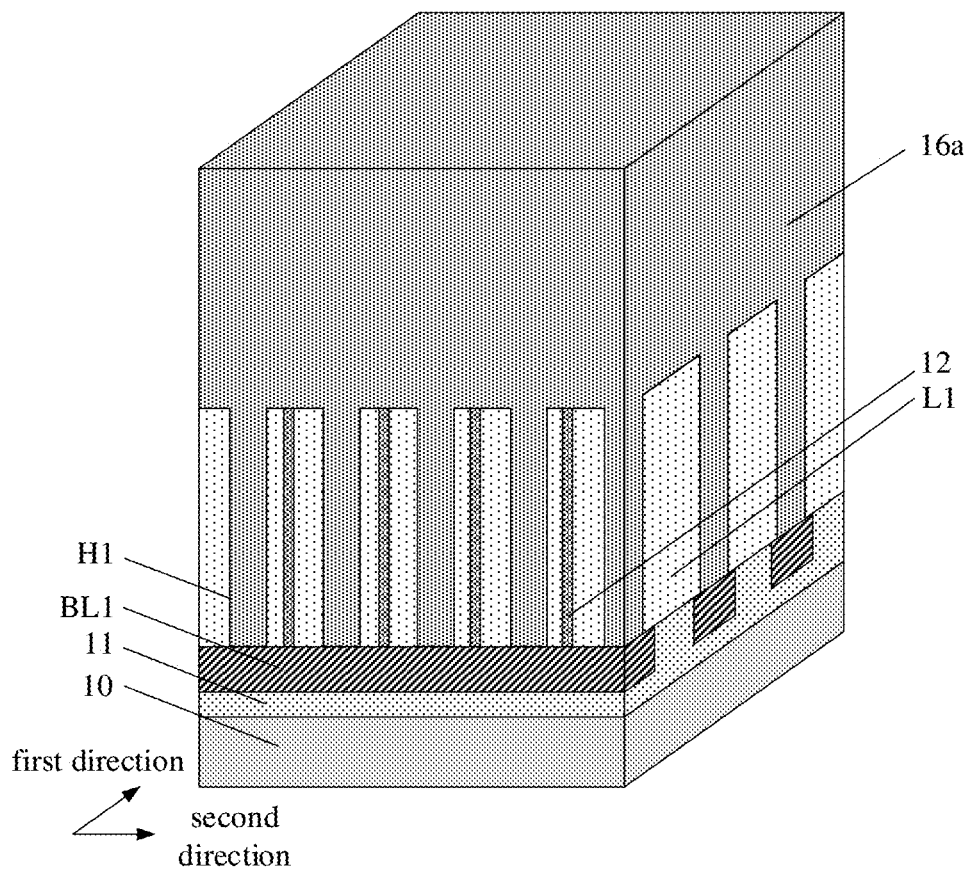
FIGS. 24 to 29 are process flow diagrams during a method for manufacturing a semiconductor structure provided by another embodiment of the disclosure.
Figure 25:
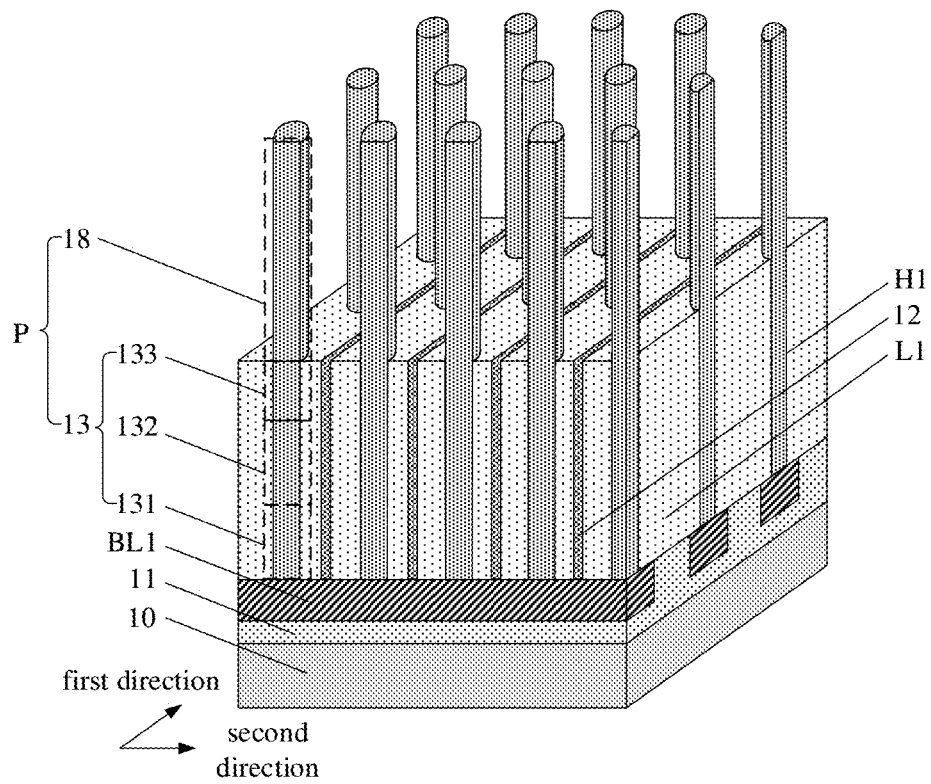

As shown in FIGS. 24 to 25, the forming the pillar P on the substrate 10 includes the following operations.

The pillar P is formed on substrate 10. The pillar P protrudes from the surface of substrate 10, and extends in the direction perpendicular to the plane of substrate 10. The pillar P includes a semiconductor pillar 13 and a gate pillar 18 located right on the semiconductor pillar 13.

In the practices, as shown in FIGS. 6 to 8, before forming the pillar P on the substrate 10, the method further includes the following operations.

A plurality of first bit lines BL1 extending in a second direction are formed on the substrate 10.

A first dielectric layer L1 is formed.

A plurality of word line isolation structures 12 extending in a first direction are formed in the first dielectric layer L1.

In some embodiments, as shown in FIGS. 9, 24, and 25, before forming the pillar P on the substrate 10, the method further includes the following operations.

The first dielectric layer L1 is etched to form a plurality of first channel holes H1 used for exposing the first bit lines BL1.

A semiconductor material layer 16a is formed. The semiconductor material layer 16a covers an upper surface of the first dielectric layer L1 and fills the first channel holes H1.

The semiconductor material layer 16a is etched to form the pillars P. Part of each pillar P located in the first channel hole H1 is defined as the semiconductor pillar 13, and part of the each pillar P located right on the first channel hole H1 is defined as the gate pillar 18.

In actual processes, the plurality of first channel holes H1 may be formed by etching the first dielectric layer L1 from top to bottom. The plurality of first channel hole H1 are located in the first dielectric layer L1 between two adjacent word line isolation structures 12.

Optionally, in some embodiments, the etching the semiconductor material layer 16a to form the pillars P includes the following operations.

The semiconductor material layer 16a is etched to remove the semiconductor material layer 16a outside regions defined by orthographic projections of the first channel holes H1 on the substrate 10, so as to remain the semiconductor material layer 16a in the first channel holes H1 and located right above the first channel holes H1, thereby forming the pillars P.

In the embodiment, the material of the semiconductor material layer includes at least one or a combination of indium oxide, tin oxide, In—Zn oxide, Sn—Zn oxide, Al—Zn oxide, In—Ga oxide, In—Ga—Zn oxide, In—Al—Zn oxide, In—Sn—Zn oxide, Sn—Ga—Zn oxide, Al—Ga—Zn oxide, or Sn—Al—Zn oxide.

Optionally, the material of the semiconductor material layer includes, but is not limited to, indium gallium zinc oxide (IGZO), such as the material with a chemical formula of $InGaZnO_4$.

In a specific embodiment, the material of the semiconductor material layer includes $In_xGa_yZn_{1-x-y}O$, where x is greater than or equal to 0, and less than or equal to 1, and y is greater than or equal to 0 and less than or equal to 1.

In this embodiment, the semiconductor pillar 13 located in the first channel hole H1 may include a first electrode 131, a first channel region 132, and a second electrode 133 distributed from bottom to top, and the first electrode 131, the first channel region 132, and the second electrode 133 have the same conductivity type.

It is to be understood that, in actual operation, the first electrode 131, the first channel region 132 and the second electrode 133 of the semiconductor pillar 13 may be used as the first source/drain region, channel region and second source/drain region of a transistor respectively.

In actual operation, a transistor structure based on the semiconductor pillar may be subsequently formed by forming control gate lines, such as word line structures, on part of the sidewall of the semiconductor pillar to control turn-on or turn-off of the channel region. When the semiconductor pillar is made of indium gallium zinc oxide (IGZO), that is the material of the channel region of the transistor structures is indium gallium zinc oxide (IGZO), not only a leakage current of the transistor structure can be effectively reduced, but also due to the same conductivity type of the first electrode, the first channel region and the second electrode, a floating body effect of the transistor structure can be effectively prevented.

Optionally, in this embodiment, the transistor structure formed on the basis of the semiconductor pillar can be used as the write transistor of the memory.

Figure 26:
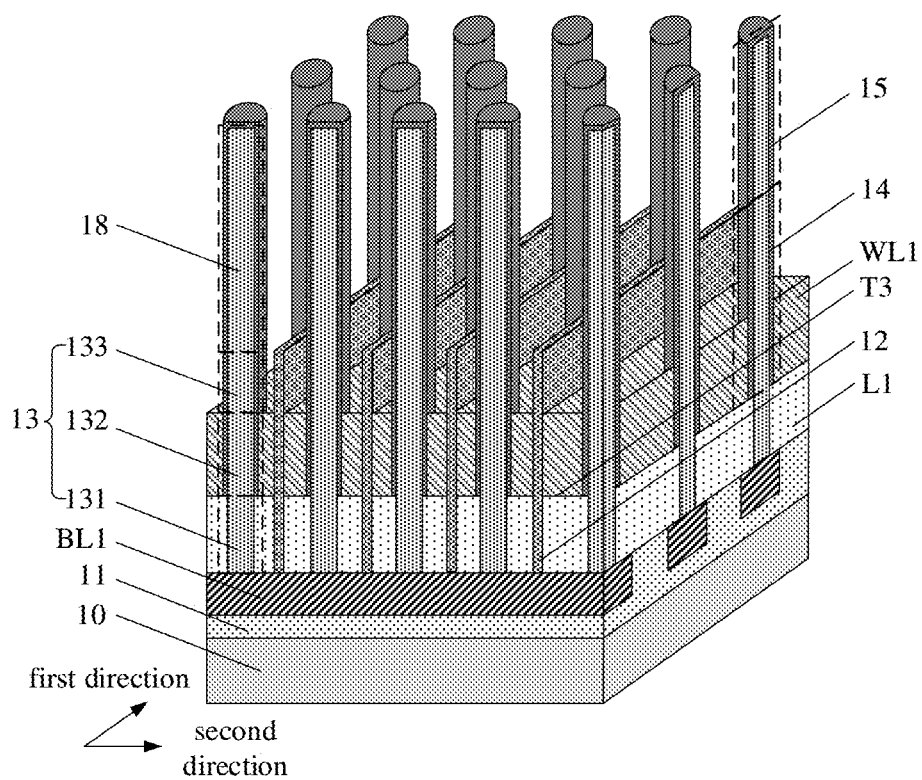

As shown in FIG. 26, the formation of the first word line WL1 extending in the first direction includes the following operations.

A plurality of third trenches T3 extending in the first direction are formed. Each of the third trenches T3 is located between two adjacent word line isolation structures 12.

A gate dielectric layer is formed. The gate dielectric layer includes a first gate dielectric layer 14 surrounding part of the corresponding semiconductor pillar 13 and a second gate dielectric layer surrounding a sidewall and a top of the gate pillar 18.

The first word line WL1 is formed in each of the third trenches T3, and surrounds part of the first gate dielectric layer 14.

In some specific embodiments, the forming the third trenches T3, includes the following operations.

Part of the dielectric layer L1 is removed to form the plurality of third trenches T3 extending in the first direction. Each of the third trenches T3 is located between two adjacent word line isolation structures 12. The bottom of the third trench T3 is flush with the upper surface of the first electrode 131.

It is to be understood that, in actual operation, the first gate dielectric layer 14 surrounds sidewalls of the first channel region 132 and the second electrode 133 of the semiconductor pillar 13. The upper surface of the first word line WL1 is flush with the upper surface of the first channel region 132.

By doing so, a plurality of transistor structures are formed in the first dielectric layer. It is to be understood that, the plurality of transistor structures can be used as the write transistors of the memory.

Figure 27:
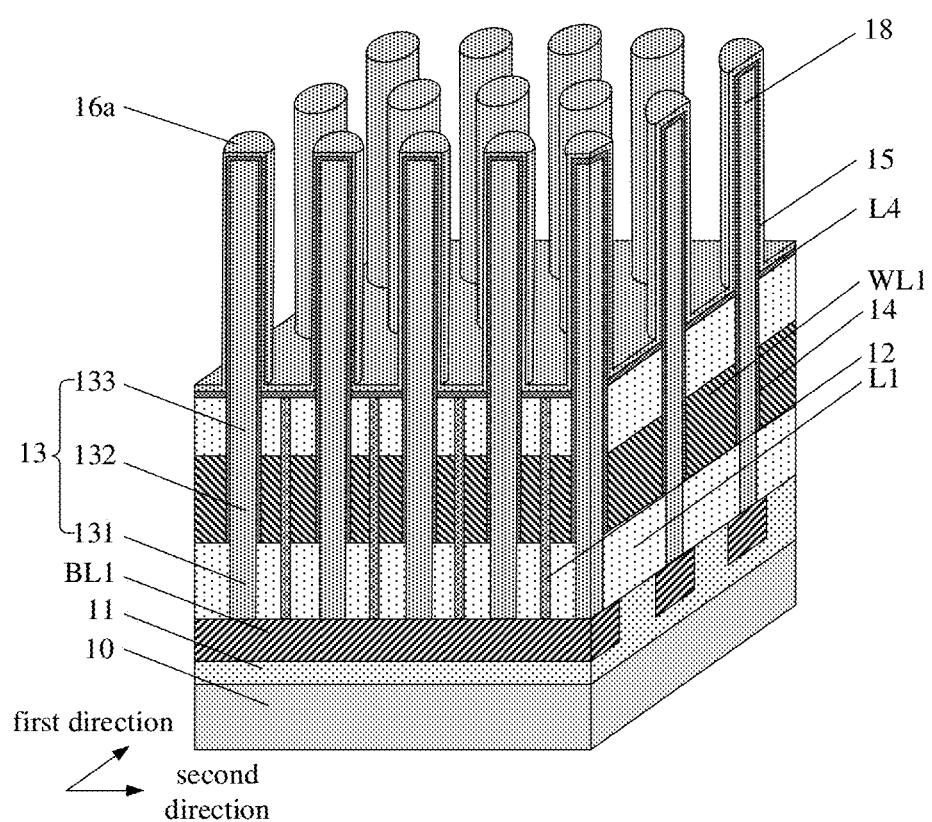
Figure 28:
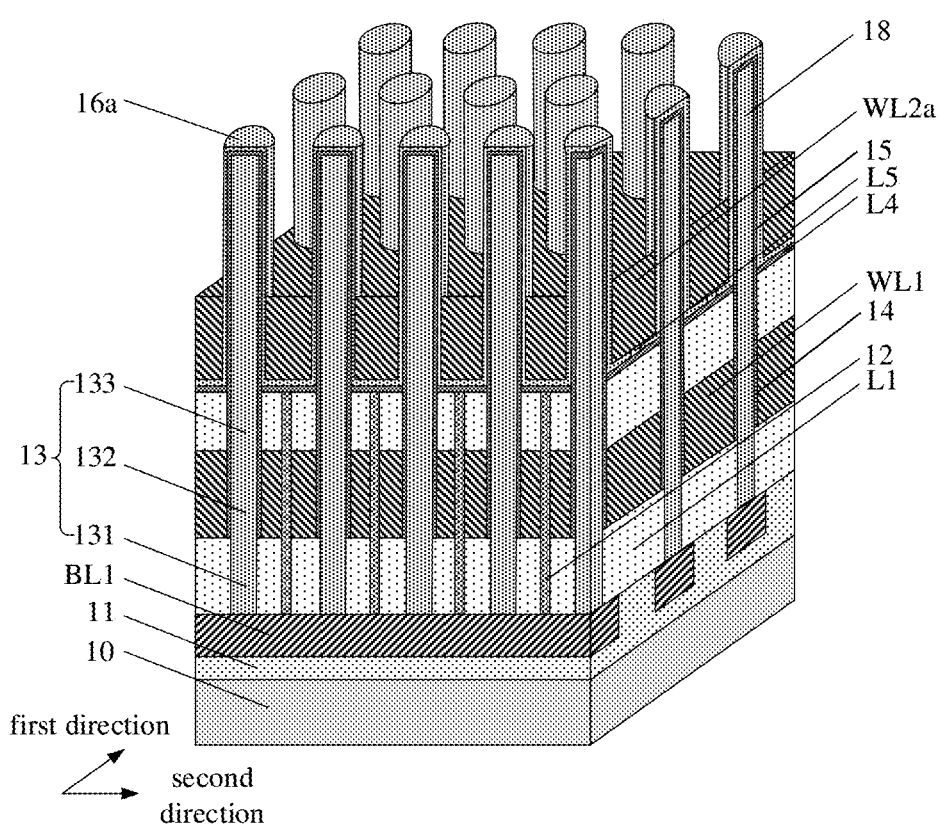

Optionally, in some embodiments, as shown in FIG. 27, after forming the first word line WL1, the method further includes the following operations.

The first dielectric layer L1 is continuously filled on the first word line WL1 and in a gap between the semiconductor pillars 13, so that a top surface of the first dielectric layer L1 is flush with upper surfaces of the second electrodes 133 of the semiconductor pillars.

A fourth dielectric layer L4 is formed. The fourth dielectric layer L4 covers the upper surface of the substrate 10 between adjacent gate pillars 18.

It is to be understood that, since the fourth dielectric layer covers the upper surface of the substrate between the adjacent gate pillars, an effect of electrical isolation can be realized between a structure located at the lower portion and around the semiconductor pillar and a structure located at the upper portion and around the gate pillar, thereby preventing mutual interference between the above structures.

Figure 29:
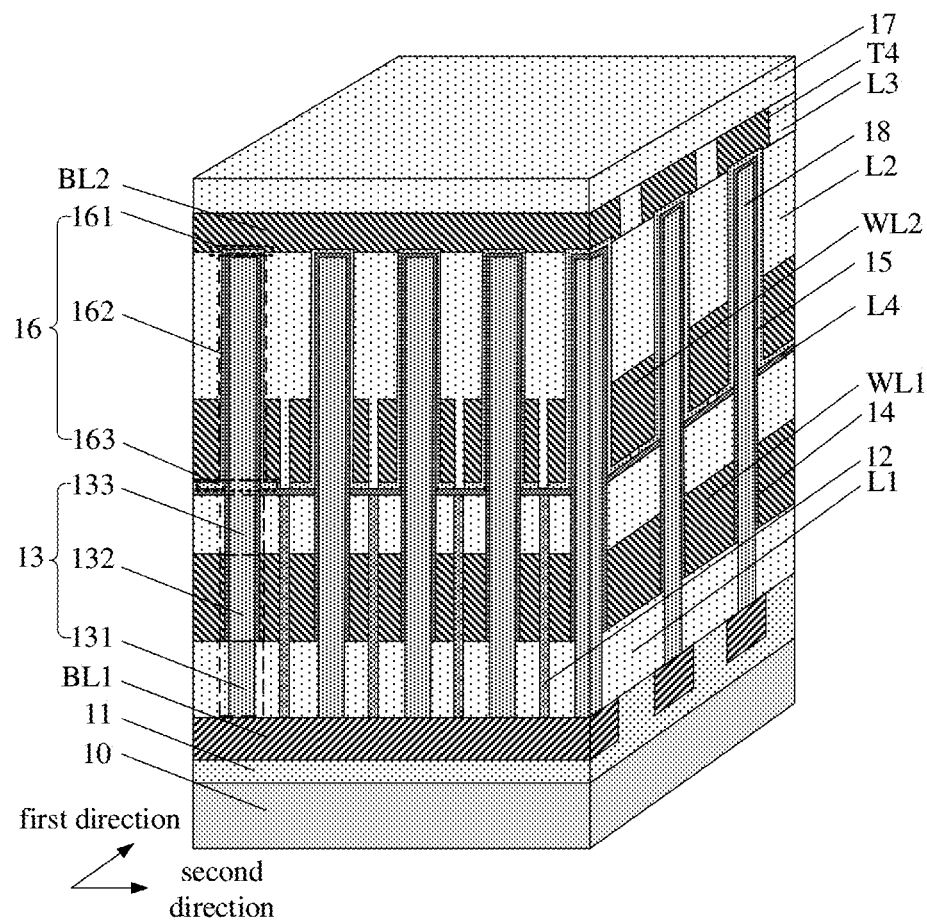

As shown in FIG. 29, a semiconductor layer 16 at least surrounding a sidewall of the gate pillar 18 is formed.

In some embodiments, as shown in FIGS. 27 and 29, after forming the first word line, the method further includes the following operations.

A semiconductor material layer 16a and a word line material layer WL2a are sequentially formed on the second gate dielectric layer 15. The semiconductor material layer 16a at least covers the second gate dielectric layer 15, while the word line material layer WL2a fills a gap between adjacent semiconductor material layers 16a.

The semiconductor material layer 16a and the word line material layer WL2a are etched to remove part of the semiconductor material layer 16a and the word line material layer WL2a located above the word line isolation structure 12, so as to respectively form the semiconductor layer 16 and a plurality of second word lines WL2 extending in the first direction.

Here, the semiconductor layer 16 includes a first sub-portion 161, a second sub-portion 162, and a third sub-portion 163 connected to each other. The first sub-portion 161 covers a top surface of the gate pillar 18, the second sub-portion 162 covers a sidewall of the gate pillar 18, and the third sub-portion 163 partially covers an upper surface of the substrate 10 between adjacent gate pillars 18.

It is to be understood that, since the semiconductor layer can be used as a channel region of the transistor, and the second sub-portion thereof covers (surrounds) the sidewall of the gate pillar, the channel region of the transistor has a larger channel size compared with a structure that a channel region is only arranged on one side of a gate, thereby effectively preventing the occurrence of short channel effect by the structure provided by the embodiment of the disclosure.

Optionally, in some embodiments, after forming the semiconductor layer 16, the method further includes the following operations.

A third dielectric layer L3 is formed.

The third dielectric layer L3 is etched to form a fourth trench T4 extending in the second direction, and used for exposing the upper surface of the semiconductor layer 16.

A second bit line BL2 is formed in the fourth trench T4.

By doing so, the plurality of transistor structures are formed in the second dielectric layer. The gate pillar may be used as the gate of the transistor structure, the semiconductor layer may be used as the channel region of the transistor structure, the second word line may be used as the source region or drain region of the read transistor, and the second bit line may be used as the drain region or the source region of the transistor structure.

It is to be noted that, when the second word line is used as the source region of the transistor structure, the second bit line is used as the drain region of the transistor structure, which is not limited thereto. In some other embodiments, the second word line may also be used as the drain region of the read transistor, and the second bit line may be used as the source region of the read transistor, which can be flexibly adjusted in actual operation and is not specifically limited herein.

In this embodiment, since the second word line surrounds the second sub-portion of the semiconductor layer as the channel regions, a contact area between the second word line and the channel region is increased, which is beneficial to reduce the contact resistance between the second word line and the channel region, thereby reducing the power consumption of the transistor structure.

It is to be understood that, the plurality of transistor structures can be used as the read transistors of the memory.

In this embodiment, the gate pillar and the semiconductor pillar are an integrated structure in which the gate pillar and the semiconductor pillar are electrically connected directly. That is, the channel region of the write transistor, the source/drain region of the write transistor and the gate of the read transistor are the integrated structure. That is, the source/drain region of the write transistor and the gate of the read transistor can be electrically connected directly without using other conductive wires. Compared with a conventional structure in which the source/drain region of the write transistor is electrically connected to the gate of read transistor through interconnecting wires, the embodiment of the disclosure can effectively shorten the charge in flow path when the charge in the write transistor is injected into the gate of the read transistor, thereby effectively improving the transmission speed and efficiency of information of the semiconductor structure. When the write transistor needs to inject charge into the gate of the read transistor through the source/drain region, there is no contact resistance in the integrated structure between the write transistor and the read transistor, which can effectively prevent the semiconductor structure from generating more heat during use, thereby effectively improving the performance of the semiconductor structure.

In addition, in an actual process, the structure composed of the gate pillar and the semiconductor pillar can be formed in the same process operation, which significantly reduces complexity of the process and is beneficial to an improvement of production efficiency.

In addition, compared with a semiconductor structure provided with capacitor structures, there is no need to additionally manufacture capacitors during the manufacture of the structure provided by the embodiments of the disclosure, and thus the process is simple. In addition, there is no need for rewriting operation after reading during the use of the structure, and thus the power consumption is reduced.

The semiconductor structure provided by the embodiments of the disclosure may be applied to a memory structure, including but not limited to, 3D dynamic random access memory (3D DRAM for short) and the like.

It is to be noted that, the method for manufacturing a semiconductor device provided by the embodiment of the disclosure is applicable to the DRAM structure or other semiconductor devices, which is not limited herein. The embodiments of the method for manufacturing a semiconductor devices provided by the disclosure and the embodiments of the semiconductor device belong to the same conception. The technical features in the technical solutions described in the embodiment may be arbitrarily combined without conflict.

The above are only the preferred embodiments of the disclosure, and are not intended to limit the scope of protection of the disclosure. Any modifications, equivalent replacements and improvements and the like made within the spirit and principle of the disclosure shall be included in the scope of protection of the disclosure.

INDUSTRIAL PRACTICALITY

Embodiments of the disclosure provide a semiconductor structure and a method for manufacturing the same. The semiconductor structure includes: a substrate; a semiconductor pillar located on the substrate and a gate pillar located on the semiconductor pillar that extend in a direction perpendicular to a plane of the substrate; a first word line extending in a first direction and surrounding the semiconductor pillar, in which the first direction is parallel to the plane of the substrate; and a semiconductor layer located above the semiconductor pillar and at least surrounding the sidewall of the gate pillar. In this way, the semiconductor pillar at the bottom and the semiconductor layers located thereon are longitudinally distributed. Therefore, when a transistor structure is subsequently formed on the basis of the semiconductor pillar and the semiconductor layer, an area occupied by the projections of the two transistors on the substrate can be significantly reduced, compared with the case that the two transistors are tiled on the substrate, thereby effectively improving the integration level of the semiconductor structure by the embodiments of the disclosure.

The invention claimed is:
1. A semiconductor structure comprising:
a substrate;
a semiconductor pillar located on the substrate and a gate pillar located on the semiconductor pillar, wherein the semiconductor pillar and the gate pillar both extend in a direction perpendicular to a plane of the substrate;
a first word line extending in a first direction parallel to the plane of the substrate and surrounding the semiconductor pillar; and
a semiconductor layer located above the semiconductor pillar and at least surrounding a sidewall of the gate pillar;
wherein the semiconductor layer comprises a first sub-portion, a second sub-portion, and a third sub-portion connected to each other, and
wherein the first sub-portion covers a top surface of the gate pillar, the second sub-portion covers the sidewall of the gate pillar, and the third sub-portion partially covers an upper surface of the substrate between adjacent gate pillars;
wherein the semiconductor structure further comprises:
a second word line extending in the first direction, surrounding an end, close to the semiconductor pillar, of the second sub-portion and covering an upper surface of the third sub-portion; and
a first bit line and a second bit line extending in a second direction parallel to the plane of the substrate and perpendicular to the first direction, wherein the first bit line is located below the semiconductor pillar and electrically connected to a lower portion of the semiconductor pillar, while the second bit line is located above the semiconductor layer and electrically connected to the first sub-portion.

2. The semiconductor structure of claim 1, wherein the gate pillar and the semiconductor pillar are in one-to-one correspondence; or
wherein a top of the semiconductor pillar is electrically connected to a bottom of the gate pillar; or
wherein an orthographic projection of the semiconductor pillar is at least partially overlapped with an orthographic projection of the gate pillar on the plane of the substrate, and a material of the gate pillar is same as a material of the semiconductor pillar.

3. The semiconductor structure of claim 1, wherein the semiconductor pillar comprises a first electrode, a first channel region, and a second electrode distributed from bottom to top, and the first electrode, the first channel region, and the second electrode are same in term of conductivity type.

4. The semiconductor structure of claim 3, wherein the semiconductor structure further comprises:
a first gate dielectric layer located between the first word line and the semiconductor pillar, and surrounding the first channel region and the second electrode; and
a second gate dielectric layer comprising a first sub-layer and a second sub-layer connected to each other, wherein the first sub-layer is located between the gate pillar and the semiconductor layer, covers a top and the sidewall of the gate pillar, while the second sub-layer covers an upper surface of the substrate between adjacent gate pillars.

5. The semiconductor structure of claim 3, wherein the semiconductor structure further comprises:
a first gate dielectric layer located between the first word line and the semiconductor pillar, and surrounding the first channel region and the second electrode;
a second gate dielectric layer covering a top and the sidewall of the gate pillar; and
a fourth dielectric layer covering an upper surface of the substrate between adjacent gate pillars.

6. The semiconductor structure of claim 1, wherein materials of the semiconductor pillar and the semiconductor layer comprise at least one or a combination of indium oxide, tin oxide, In-Zn oxide, Sn-Zn oxide, Al-Zn oxide, In-Ga oxide, In-Ga-Zn oxide, In-Al-Zn oxide, In-Sn-Zn oxide, Sn-Ga-Zn oxide, Al-Ga-Zn oxide, or Sn-Al-Zn oxide.

7. The semiconductor structure of claim 1, wherein the semiconductor structure further comprises: a word line isolation structure extending in the first direction and located between two adjacent first word lines to isolate the adjacent first word lines; or
wherein the semiconductor structure further comprises: a first dielectric layer located above the substrate and a second dielectric layer located above the first dielectric layer, wherein the semiconductor pillar and the first word line are located in the first dielectric layer, while the gate pillar, the semiconductor layer and a second word line are located in the second dielectric layer.

* * * * *

UNITED STATES PATENT AND TRADEMARK OFFICE
CERTIFICATE OF CORRECTION

PATENT NO. : 12,471,274 B2  
APPLICATION NO. : 18/167132  
DATED : November 11, 2025  
INVENTOR(S) : Deyuan Xiao et al.

Page 1 of 1

It is certified that error appears in the above-identified patent and that said Letters Patent is hereby corrected as shown below:

On the Title Page

Item (63), please correct Related U.S. Application Data from:  
Continuation of application No. PCT/CN2022/112956, filed on Aug. 7, 2022.  
To:  
Continuation of application No. PCT/CN2022/112956, filed on Aug. 17, 2022.

Signed and Sealed this  
Thirtieth Day of December, 2025

John A. Squires  
*Director of the United States Patent and Trademark Office*